(12) United States Patent
Luquist et al.

(10) Patent No.: US 10,671,772 B2
(45) Date of Patent: Jun. 2, 2020

(54) COMPUTER-IMPLEMENTED IMPACT ANALYSIS OF ENERGY FACILITIES

(71) Applicant: INDEPENDENT ENERGY STANDARDS CORPORATION, San Francisco, CA (US)

(72) Inventors: Devin Luquist, San Francisco, CA (US); Horace James Caulkins, V, San Francisco, CA (US)

(73) Assignee: INDEPENDENT ENERGY STANDARDS CORPORATION, San Francisco, CA (US)

( * ) Notice: Subject to any disclaimer, the term of this patent is extended or adjusted under 35 U.S.C. 154(b) by 890 days.

(21) Appl. No.: 15/257,755

(22) Filed: Sep. 6, 2016

(65) Prior Publication Data
US 2017/0068761 A1    Mar. 9, 2017

Related U.S. Application Data

(60) Provisional application No. 62/214,715, filed on Sep. 4, 2015.

(51) Int. Cl.
*G06F 17/50* (2006.01)
*G06F 30/20* (2020.01)
(Continued)

(52) U.S. Cl.
CPC ......... *G06F 30/20* (2020.01); *G06Q 10/0639* (2013.01); *G06Q 50/06* (2013.01); *Y02P 90/82* (2015.11)

(58) Field of Classification Search
CPC . G06F 17/5009; G06Q 10/0637; G06Q 50/06
See application file for complete search history.

(56) References Cited

PUBLICATIONS

Center for Chemical Process Safety, "Guidelines for Chemical Process Quantitative Risk Analysis, Second Edition," "Chapter 1, Chemical Process Quantitative Risk Analysis," 2010, American Institute of Chemical Engineers, pp. 1-55 (Year: 2010).*

(Continued)

*Primary Examiner* — Kamini S Shah
*Assistant Examiner* — Russ Guill
(74) *Attorney, Agent, or Firm* — Hickman Palermo Becker Bingham LLP

(57) ABSTRACT

A data processing method for execution using a programmed computer to generate an objective score value specifying an estimated impact of an oil or gas processing operation comprises: receiving a plurality of data associated with the oil or gas processing operation; identifying, using the plurality of data, a plurality of events that may occur during the oil or gas processing operation; for each event of the plurality of events, determining a relative weighting of potential impact of the event for the oil or gas processing operation using local conditions and a master event profile for the event; for each event of the plurality of events, determining an effectiveness of one or more control efforts; for each event of the plurality of events, determining a score using the relative weighting of the potential impact of the event and the effectiveness of the one or more control efforts; determining the objective digitally stored score value for the oil or gas processing operation using the score for each event of the plurality of events and benchmarking the objective digitally stored score value to a plurality of objective digitally stored score values for other oil or gas processing operations.

20 Claims, 28 Drawing Sheets

(51) Int. Cl.
    *G06Q 10/06*     (2012.01)
    *G06Q 50/06*     (2012.01)

(56) References Cited

PUBLICATIONS

Center for Chemical Process Safety, "Guidelines for Chemical Process Quantitative Risk Analysis, Second Edition," "Chapter 3, Event Probability and Failure Frequency Analysis," 2010, American Institute of Chemical Engineers, pp. 297-393 (Year: 2010).*

Mohammad Javad Jafari et al., "The credit of fire and explosion index for risk assessment of iso-max unit in an oil refinery," 2012, International Journal of Occupational Hygiene, vol. 4, No. 1, pp. 10-16 (Year: 2012).*

S.M. Miri Lavasani et al., "Fuzzy risk assessment of oil and gas offshore wells," 2011, Process Safety and Environmental Protection, vol. 89, pp. 277-294 (Year: 2011).*

F.I. Khan et al., "Safety weighted hazard index (swehi) a new, user-friendly tool for swift yet comprehensive hazard identification and safety evaluation in chemical process industries," 2001, Transactions of the Institution of Chemical Engineers, vol. 79 Part B, 16 pages (Year: 2001).*

Sam Mannan, "Lee's loss prevention in the process industries," 2012, Butterworth-Heinemann, 8 pages. (Year: 2012).*

Faisal I. Khan et al., "Multivariate hazard identification and ranking system," 1998, Process Safety Progress, vol. 17, No. 3, 14 pages (Year: 1998).*

"Operational risk management in the energy industry," 2014, Management Solutions, 10 pages (Year: 2014).*

"Control Effectiveness," May 2014, Broadleaf Capital International Pty Ltd, 7 pages (Year: 2014).*

Jim Joy et al., "National minerals industry safety and health risk assessment guideline" 2007, http://www.nost.edu.au/icms_docs/286339_National_Minerals_Industry_Safety_and_Health_Risk_Assessment_Guideline_-_Jim_Joy.pdf, 164 pages (Year: 2007).*

Maureen Hassall, "What is a control?," Aug. 31, 2015, 2015 NSW Mining-Health, Safety, Environment and Community Conference, 33 pages (Year: 2015).*

* cited by examiner

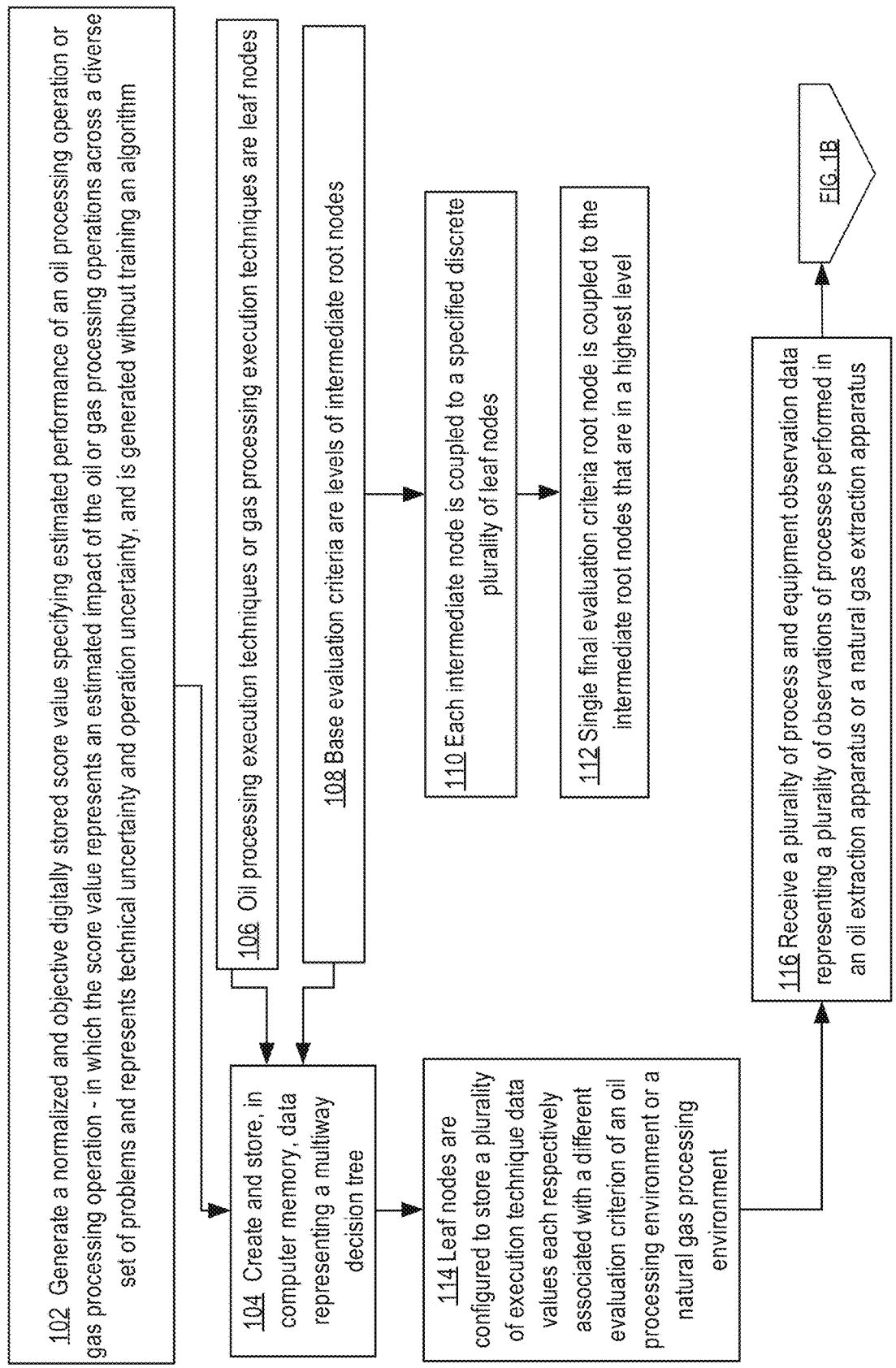

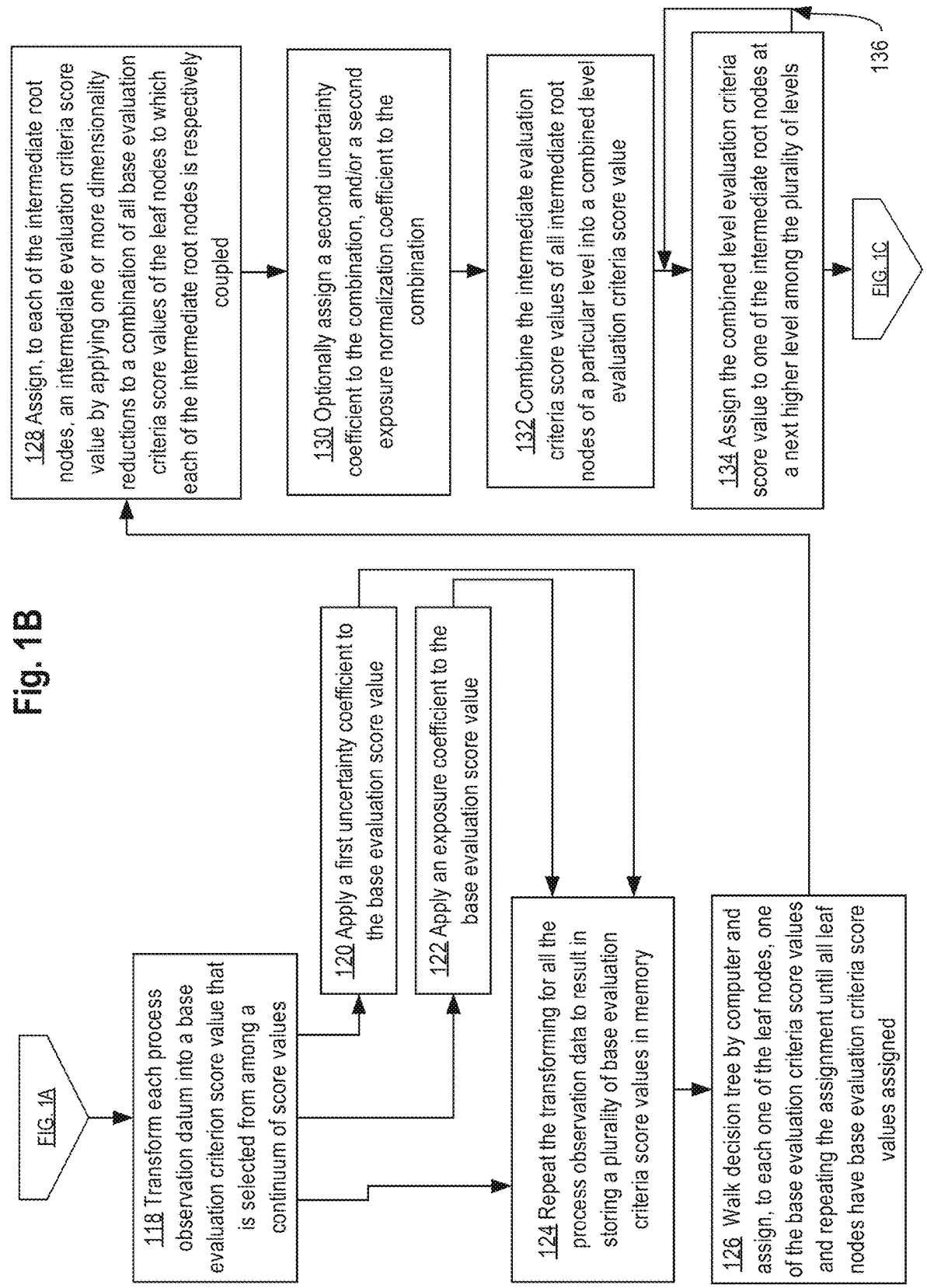

138 Generate final expected impact value based on combining the combined level evaluation score values of all intermediate root nodes to which the single final evaluation criteria root node is coupled Decision Tree Branch for Intermediate Cement Evaluation

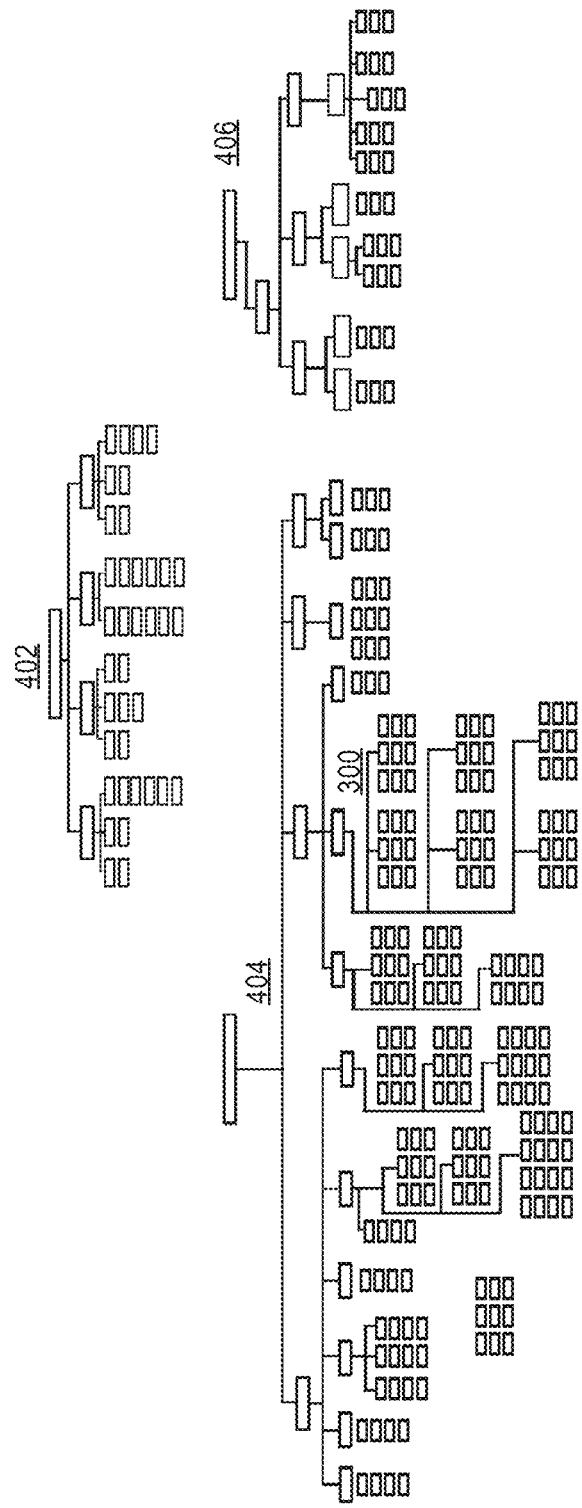

Fig. 5

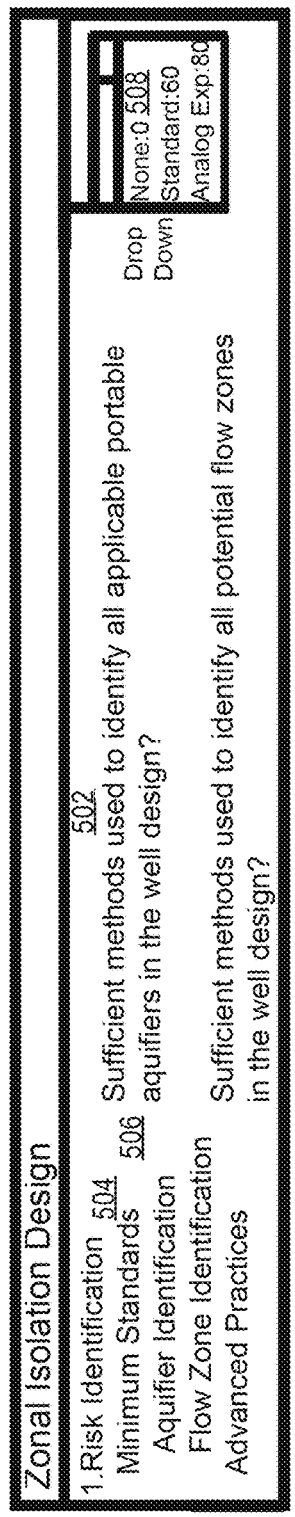

Simple, Mutually Exclusive, Objective Quality Scoring Method

Zonal Isolation Design
1. Risk Identification 504
   Minimum Standards 506  Sufficient methods used to identify all applicable portable aquifers in the well design?
   Aquifer Identification
   Flow Zone Identification  Sufficient methods used to identify all potential flow zones in the well design?
   Advanced Practices

502

Drop Down 508
None:0
Standard:60
Analog Exp:80

Fig. 6

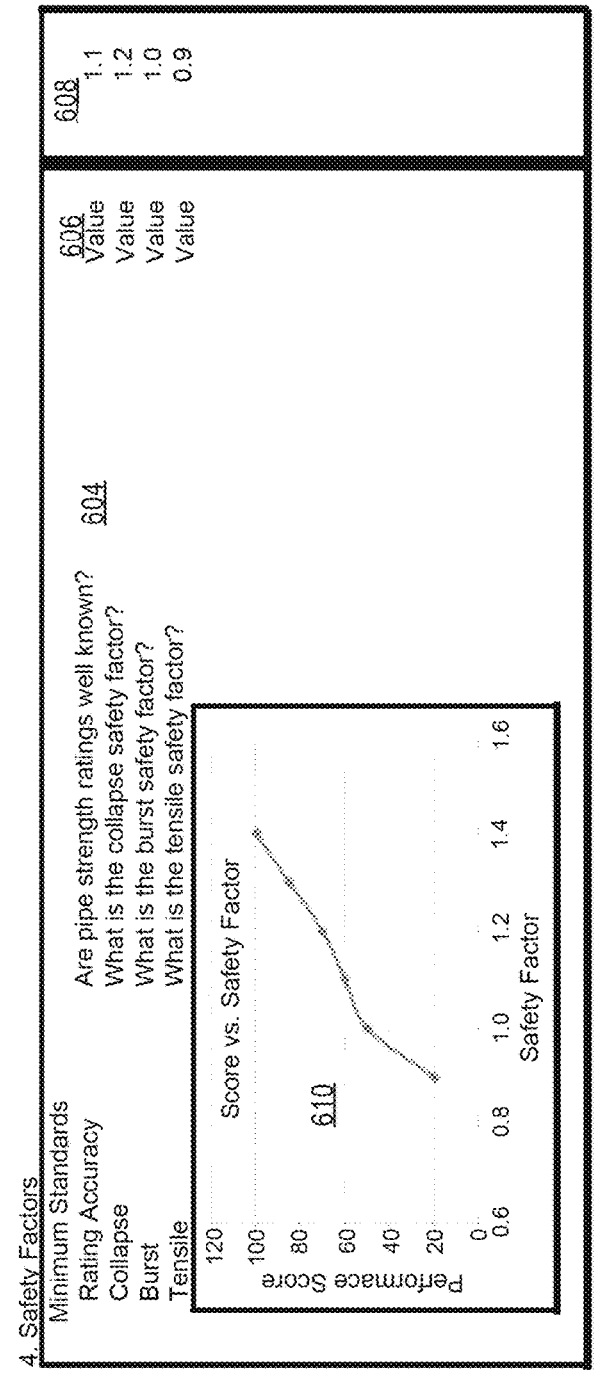

Value Assessment: Numerical Value -> Score Via Equation

4. Safety Factors
   Minimum Standards
   Rating Accuracy    Are pipe strength ratings well known?    604    606 Value    608 1.1
   Collapse           What is the collapse safety factor?             Value        1.2
   Burst              What is the burst safety factor?                Value        1.0
   Tensile            What is the tensile safety factor?              Value        0.9

610 Score vs. Safety Factor

Fig. 8

Example Cementing Scoring Logic

| Cement Design | Cement Placement | Operational Indicators | Evaluation | Score | |
|---|---|---|---|---|---|
| 100 | 100 | 100 | 100 | 100 | |
| 0 | 0 | 0 | 0 | 0 | |
| 80 | 80 | 80 | 80 | 80 | |
| 100 | 100 | 100 | 50 | 80 | * Recognizes the relative importance of placement operations |
| 100 | 0 | 100 | 100 | 50 | |
| 100 | 100 | 0 | 0 | 60 | * Gives credit for going above and beyond with multiple barriers |

| Operational Risk | Event Profile | Control Effects | Water | Land | Community | Total |
|---|---|---|---|---|---|---|
| Equipment Leaks | 78 | 78% | 141 | 127 | | 134 |
| Waste Impacts | 38 | 74% | 124 | 107 | 150 | 121 |
| Well Collision | 63 | 50% | 125 | 98 | | 107 |
| Well Control - Drilling | 39 | 46% | 107 | 98 | 91 | 91 |
| Transportation Leaks | 53 | 35% | 100 | 92 | 71 | 87 |

Table 2700
Rows 2702
Columns 2704
First Row 2706

Objective Score: 103
2708

FIG. 27

COMPUTER-IMPLEMENTED IMPACT ANALYSIS OF ENERGY FACILITIES

BENEFIT CLAIM

This application claims the benefit under 35 U.S.C. § 119 of provisional application 62/214,715, filed Sep. 4, 2015, the entire contents of which are hereby incorporated by reference for all purposes as if fully set forth herein.

FIELD OF THE DISCLOSURE

The present disclosure generally relates to computer-based generation of score values pertaining to industrial facilities. The disclosure relates more specifically to a scoring process that is particularly applied by computer for scoring the conformance of oil facilities or gas facilities to practice guidelines.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Oil and gas facilities, such as wells, well support apparatus, transmission systems and the like, fundamentally support civilized society by providing sources of efficient consumable energy. However, if these facilities are not constructed, maintained or operated according to recognized practices pertaining to safety, operations and maintenance, accidents or failures can occur with serious consequences to people and the environment. Therefore, the oil and gas industry has developed a need to evaluate and compare the performance of oil and gas facilities to various guidelines for safety and operation.

To date, determining whether such facilities are safe typically has involved human inspection and reporting, both by industry and by government. A lack of industry self-governance is expected to cause government to intrude with new regulations based upon guidelines or metrics with which industry may disagree. The development of improved industry self-monitoring, according to industry-accepted guidelines, is viewed as a beneficial way to reduce the intrusion of government into the industry.

In other fields, computer-based scoring systems have been used. For example, in the field of consumer finance, the FICO score is a recognized metric for comparative measurement of creditworthiness. Based upon input values such as consumer income, consumer debt, number of debt items, and geographic location, the FICO score presents a consolidated view of lending risk associated with the consumer.

In light of recent highly publicized incidents involving energy production facilities such as oil and gas wells, stakeholders have expressed a desire to better understand the technically complicated and often obscure risks that oil and gas operators are taking as they extract our natural resources. However, condensing a vast number of data fields into a single, representative score is technically challenging and has only been accomplished in a few ways. By far, the most common method of assessment is using a manual checklist that explicitly calls out discrete items which must accomplished. This method is simple, objective and intuitive. An assessor, who may be an end user of the computer systems described herein, can guarantee that bare minimums are met and be confident in what the assessment represents. In the oil and gas field, this is the approach taken by organizations like Equitable Origins and Center for Sustainable Shale Development. Outside the oil and gas industry, the USGBC has improved on a simple check list by adding different weighting values in their LEED rating. This method adds a bit more intelligence to a simple check list and allows the most important elements to carry more weight; however the check list method is inherently limited in several ways.

First, it is inflexible because it explicitly requires specific components without considering the relative exposure. "Exposure," in this context, refers to the likelihood of occurrence of an incident, such as the risk of a safety violation or apparatus failure resulting in damage to persons, property or environment. This inflexible approach results in a weak, bare minimum rating, which cannot consider the nuances of different areas or an overly harsh or conservative rating which is not normalized across different exposures. Second, the method cannot consider the relative importance of combinatorics problems. For example, in a set of five options, the first, second and third options together may be worth the same as option four alone. Neither a relative ranking scheme nor flat averages can account for these relative relations. Third, this method cannot appropriately account for uncertainty. If an answer is unknown it must be checked "No." Users of check lists, like the USGBC, have simply given a 0 for each item which cannot be verified, encouraging their clients to provide information, but this approach can severely limit the usefulness of an assessment and is not practical when uncertainty stems from more than just document availability. Fourth, the checklist method must make a cost benefit trade off and decide on the "right" way to do things. In reality, there are likely a number of equivalent ways to do things; such nuances are not captured. Additionally the best performers are not given recognition for going above and beyond this standard, reducing incentive to do so. This is a problem that regulatory rule makers face alongside those groups creating standards. Finally, none of the checklist methods purport to offer an estimate of "expected impact." They are neither comprehensive nor analytical enough to do so.

In the end, checklists represent a version of reality but are severely limited due to the above shortcomings.

In finance, FICO has capitalized on the abundance of information to generate a scoring algorithm that does a better job of representing reality but it is heavily dependent on vast amounts of data. The FICO score algorithm does not solve the four problems listed it above; it avoids the first, third and fourth by leveraging the abundance of data and resulting correlations, and uses a relative weighting scheme to address the second, which is largely sufficient because all the parts are statistically related.

On balance, prior approaches consist of: Process measurements, which are converted to a score via a checklist and weighting, and data measurements that are converted to a score via decision tree+algorithm. The process measurement approach is challenged by limited data and has a complicated link between process and performance. It is subject to the five issues summarized above, and often represents a single option rather than a continuum of choices. The data measurement approach is dependent on obtaining good quality data; it provides a less constrained environment and no uncertainty, flexibility or exposure concerns because data is normalized at top level already.

SUMMARY OF THE DISCLOSURE

The appended claims may serve as a summary of the invention.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1A, FIG. 1B, and FIG. 1C illustrate an example algorithm that may be implemented using one or more computer programs to implement an embodiment.

FIG. 4 illustrates a high-level scoring structure.

FIG. 5 illustrates an example of selecting quality in a situation in which values are mutually exclusive.

FIG. 6 illustrates an example of value assessment in which numerical values yield a score via an equation.

FIG. 8 illustrates an example scoring table that can be used as the basis of programmed logic.

FIG. 22 illustrates an example screen display of a computer display device showing an assessment interface.

FIG. 23 illustrates an example screen display of a computer display device showing a content development interface.

FIG. 27 illustrates an example objective score in accordance with an embodiment.

DETAILED DESCRIPTION

Figures 1B, 1C:
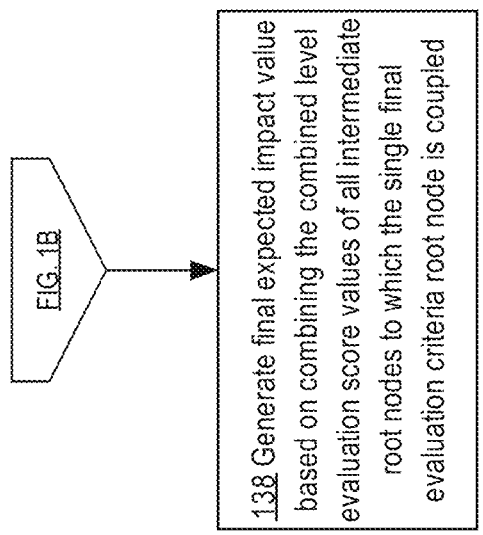

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Embodiments are described according to the following outline:
1. GENERAL OVERVIEW
2. OVERVIEW OF BENEFITS AND IMPROVEMENTS
3. STRUCTURAL AND FUNCTIONAL OVERVIEW
3.1 BASE EVALUATION CRITERIA
3.2 SCORING THE EXECUTION TECHNIQUES ASSOCIATED WITH A TREE
3.3 SCORING RELATIVE AND INTERRELATED PERFORMANCE
3.4 UNCERTAINTY MANAGEMENT
3.5 FLEXIBLE SCORING FRAMEWORK
3.6 EXPOSURE NORMALIZATION
4. IMPLEMENTATION EXAMPLE—HARDWARE OVERVIEW
5. EXAMPLE FIGURES
6. EXAMPLE SYSTEM IMPLEMENTATION
7. EXAMPLE FUNCTIONAL IMPLEMENTATION
8. IMPLEMENTATION EXAMPLE

1. General Overview

In one embodiment, a data processing method is provided for execution using a programmed computer to generate a normalized and objective digitally stored score value specifying estimated performance of an oil processing operation or gas processing operation, in which the score value represents an estimated impact of the oil or gas processing operations across a diverse set of problems and represents technical uncertainty and operation uncertainty. "Impact," in this context, refers to a benefit in relation to safety, health, production efficiency or economics. The score value is generated in an absence of data used to train an algorithm. The method comprises creating and storing, in computer memory, data representing a multiway decision tree and representing a plurality of oil processing execution techniques or gas processing execution techniques as leaf nodes, a plurality of base evaluation criteria as a plurality of levels of intermediate root nodes wherein each of the intermediate nodes is coupled to a specified discrete plurality of the leaf nodes, and a single final evaluation criteria root node that is coupled to those intermediate root nodes that are in a highest level among the plurality of levels. The leaf nodes are configured to store a plurality of execution technique data values each respectively associated with a different evaluation criterion of an oil processing environment or a natural gas processing environment.

The process further comprises receiving a plurality of process and equipment observation data representing a plurality of observations of processes performed in an oil extraction apparatus or a natural gas extraction apparatus.

The process further comprises transforming each process observation datum into a base evaluation criterion score value selected from among a continuum of score values, and optionally one or more of: applying a first uncertainty coefficient to the base evaluation score value, or applying an exposure coefficient to the base evaluation score value; and repeating the transforming for all the process observation datum to result in storing a plurality of base evaluation criteria score values in the memory. In one embodiment, the uncertainty coefficient is applied only at the base evaluation criterion level at a leaf node level in the decision tree. In this way the uncertainty coefficient may be used to record that a particular technique is not applicable, less effective or particularly important in the technical environment at hand. Exposure may be applied again at a theme level, and normally not at all intermediate levels, for conditions or practices that are important.

The method further comprises assigning, to each one of the leaf nodes, one of the base evaluation criteria score values and repeating the assignment until all leaf nodes have base evaluation criteria score values assigned. One of the assigned values may be a "no record" value.

The method further comprises assigning, to each of the intermediate root nodes, an intermediate evaluation criteria score value by applying one or more dimensionality reductions to a combination of all base evaluation criteria score values of the leaf nodes to which each of the intermediate root nodes is respectively coupled and one or more of: applying a second uncertainty coefficient to the combination, and applying a second exposure normalization coefficient to the combination. The method further comprises combining the intermediate evaluation criteria score values of all intermediate root nodes of a particular level into a combined level evaluation criteria score value and assigning the combined level evaluation criteria score value to one of the intermediate root nodes at a next higher level among the plurality of levels, and repeating for all the levels. The method further comprises generating a final expected impact value based upon combining the combined level evaluation criteria score values of all the intermediate root nodes to which the single final evaluation criteria root node is coupled.

In one embodiment, a computer-implemented automated scoring process involves the following general steps. Expert technical input is received from engineers, operators, and regulators to produce a collection of tasks that represent industry best practices, subject to a feedback loop providing continuous evaluation. An example might be the designed value of cement strength in a well string. Tasks are evaluated by engineers using a set of key performance indicators that represent industry best practices and represent a measure of execution quality for a facility; the engineering evaluation yields a set of task scores.

A risk management framework defines specific focus areas and how manual tasks are converted to a representative score. This scoring framework is constructed visually, and with the task scores, provides input to an automated scoring system that is programmed to perform a consistency check and calculate automated scoring according to weighting surfaces and a scoring tree, to yield a set of final scores.

The relative weighting surfaces comprise stored data representing a multi-dimensional surface that defines relationships between line items in the input matrix that was produced by engineering evaluation. Relative weighting of line items is produced through data analysis, as further described herein, and expert intuition. The resulting weights are captured in surfaces that permit a service provider to define a large array of relative combinations of metrics.

The final scores are visually displayed on a computer screen display. In one approach, the final scores are expressed in a graphical tree to enable rapid context analysis of the results. The final scores optionally may be blended into a single risk management score, which may be specific to a particular facility or item, such as an oil well or gas well.

2. Overview of Benefits and Improvements

The risk assessment algorithm represented in the foregoing overview may be used to generate a normalized and objective score that is representative of the expected impact of oil or gas operations across diverse exposures or challenges while managing the inherent technical and operation uncertainty and without extensive data to train the system, as training is impractical due to the high impact or low occurrence nature and difficulties of monitoring. The risk score described herein provides the transparency needed to relatively and absolutely rank the performance of operators and provides investors, insurers, regulators and the public a mechanism to express their preferences for environmental responsibility. In this way the risk score also provides a market mechanism to optimize the impact of oil or gas development.

Ultimately, in an embodiment the risk score is formed from individual expected impact values, such that $$\text{Expected Impact} = \text{Exposure} * \text{Residual Chance of Incident}$$

Thus a risk score as described herein measures an expected impact, which is directly proportional to the responsible performance of an operator. In the expression above, Residual Chance of Incident is a measurement of the chance of incident AFTER a company's mitigation efforts. Exposure is a measure of the severity of impact if it were to occur.

By independently measuring exposure and the residual chance of impact, the system can realistically assess expected impact. A good responsibility score does not require onerous barriers in a benign environment, but an operator is also rewarded for going above and beyond the needs of their particular environment. Additionally, as exposure increases the expectations increase. This approach allows the system to applicable across a vast array of environments and exposures, offering normalized scores in very different areas. Consequently, embodiments provide a major departure from existing manual check list assessments, which end up requiring unnecessary and even impossible measures in different environments.

The score value permits relative comparison of systems. Because the score normalizes for location, any single operator's performance can be compared to any other operator's performance. Similarly, one could compare performance in a single basin, between companies in a basin or even individual wells. Absolute comparison also is possible. In an embodiment, scores are presented along a continuum of feasible expected impact values. This can be useful for relative comparisons, but it is also beneficial to understand the meaning of an expected impact in real-world terms. The system herein allows comparisons to standards of regulators and NGOs to help qualify absolute impact. However, it can also go a step further and predict actual impact based on an observed process and resulting expected impact score.

Embodiments as further described in the next sections offer significant benefits and improvements over prior practice. System innovations include the following. First, embodiments can provide the basis for a market mechanism by which stakeholders such as government regulators, investors, insurers or others can make decisions or take action with respect to rules, laws, discounts, royalties, taxes or political pressure. Scoring as described herein could form a basis for reaching an appropriate balance of cost versus impact, and may provide a better basis for action than waiting for regulators to write rules to address incidents. Further, based upon the final expected impact value, an energy producer or other end user may use the computer to undertake modifying at least one physical feature of a well that has been drilled, or is undergoing drilling, and associated with the oil processing operation or gas processing operation.

The scoring approach disclosed herein represents a significant change from the current system which requires a single or group of stakeholders to arbitrarily choose the "right" level of impact, which is an inherently slow and inefficient process. In sharp contrast, the present approach allows for market pricing of responsibility and allows the market to set an efficient level. For example, investors have expressed a preference for responsibility by offering a lower cost of capital to responsible operators. Insures have expressed a preference for responsibility by offering reduced premiums to responsible operators. Regulators have expressed a preference for responsibility by offering permitting, royalty, tax and access benefits to responsible operators. Communities have expressed preference for responsibility by supporting the operation of responsible operators and allowing them access to their land. Each of these examples provides monetary value to responsible operation as a result of the transparency enabled by the rating system disclosed herein and enabled by the continua rating methodology described herein.

In particular, embodiments also are configured to represent relative performance on normalized continua which is applicable across a vast area of environments and exposures and provide far more detail and flexibility than the use of a single stamp or certification level. Continuous performance assessments allow users to infinitely differentiate operators and continuously price the value of responsible performance as opposed to discrete performance levels which would have less power as a market tool. Normalized performance assessments allow the comparison of different operators from widely varying exposures and environments, of which there are many in the oil or gas industry. Continuous performance assessments provide marginal incentive for increasing performance and reward or differentiate the best operators instead of merely setting a minimum bar. Regulatory requirements and existing standards can be simulated in the system and represented as a score on the continuum. In this way the normalized, continuous scoring method allows simple comparison of different rules or regulations as well as performance against those standards.

Embodiments may be configured to represent a score as actual "Expected Performance." Since a final score value represents "Expected Impact," it can be depicted as any of a plurality of real life realizations to help users understand the meaning of the number. By running risk models the system can calculate expected spill volume, risk of a major incident, and other specific physical outcomes. This is valuable to insurers, but is also beneficial as parties weigh the cost or benefit trade off and decide what level of expected impact and score are acceptable.

Embodiments may provide one or more of the following technical improvements with respect to field decision analysis. A framework to convert process assessments into the most representative measure of reality feasible. Key evaluation areas may be identified in order to allow a flexible assessment on a continuum.

Embodiments may be programmed using an algorithm for objectively converting process observations to a quality and expected impact measurement along a continuum. This is a key departure from the previous art, which either required large amounts of data or was incapable or representing relative performance or continua performance. This is applied at the leaf level of the decision tree described herein, in which combinations of discrete observations are converted to continua scores. Various methods of achieving this include a preferred and elegant structural method that allows for rapid expansion of system knowledge. A more comprehensive assessment makes this ability more important.

Embodiments may be programmed using an algorithm for scoring the relative and interrelated performance of various combinations of processes such that scores can be generated automatically and intelligently. This is applied both at the leaf level and as well as along the entire tree. Current score combination systems rely on weighted averages to account for relative performance, which is an improvement over flat averages but cannot account for the interdependencies of criteria. In contrast, the algorithm herein understands the interrelation of items and can apply synergistic effects.

Embodiments may be programmed using an uncertainty management algorithm that improves with data, prices the value of certainty and enables the system to manage and compare various levels of assessment, quality, cost and depth. Due to the cost of data acquisition, data quality issues, high variability in the ability to pay, and large variations in data certainty, the inventors have found it important to effectively manage uncertainty, rather than merely rounding values up or down. In an embodiment, an uncertainty management system permits expressing certainty in a specific measurement and an entire assessment. In an embodiment, the uncertainty measurement system also allows the computer system to price the value of further work or investigation. For an insurance client, higher certainty and reduced variability can help solidify total exposure and exposure variability. For all other stakeholders, since a score is based on a position in a score distribution, lower uncertainty also directly relates to a more accurate score and may correlate with reduced risk. In an embodiment, the score distribution is tied to expected performance based on key indicators, a process which will become more exact as more data is collected.

In an embodiment, a flexible scoring framework allows the system to capture and intelligently weight the importance of variables across exposures and environments. "Flexible," in this context, means designed to continually grow; as new ways of achieving a goal are discovered, they can be added to the system without altering the scoring logic. Based on the scoring structure, the system can automatically process such additions. In an embodiment, the system is designed from the standpoint that actual engineering application in the field is nuanced. Based on exposure characteristics, which are separately assessed, the system properly weights and turns on or off different processes. The system also continuously improves as it receives new data that reflects engineering assessments of new locations.

In an embodiment, an exposure normalization algorithm allows scores to be presented on a normalized continua. While exposure is assessed at the leaf level in the tree, in terms of the weighting and applicability of line items, the key goal of this assessment is flexibility. Based on the same exposure assessment that drives the adjustment at the leaf level, high level categories in the system are normalized for exposure to convert a "performance score" into a "responsibility score." In a high exposure area a higher performance score may be required to achieve the same responsibility score, thereby normalizing performance for exposure. The system also may be designed and automated such that it is objective and eliminates "double assessing" exposure.

3. Structural and Functional Overview

Figure 2:
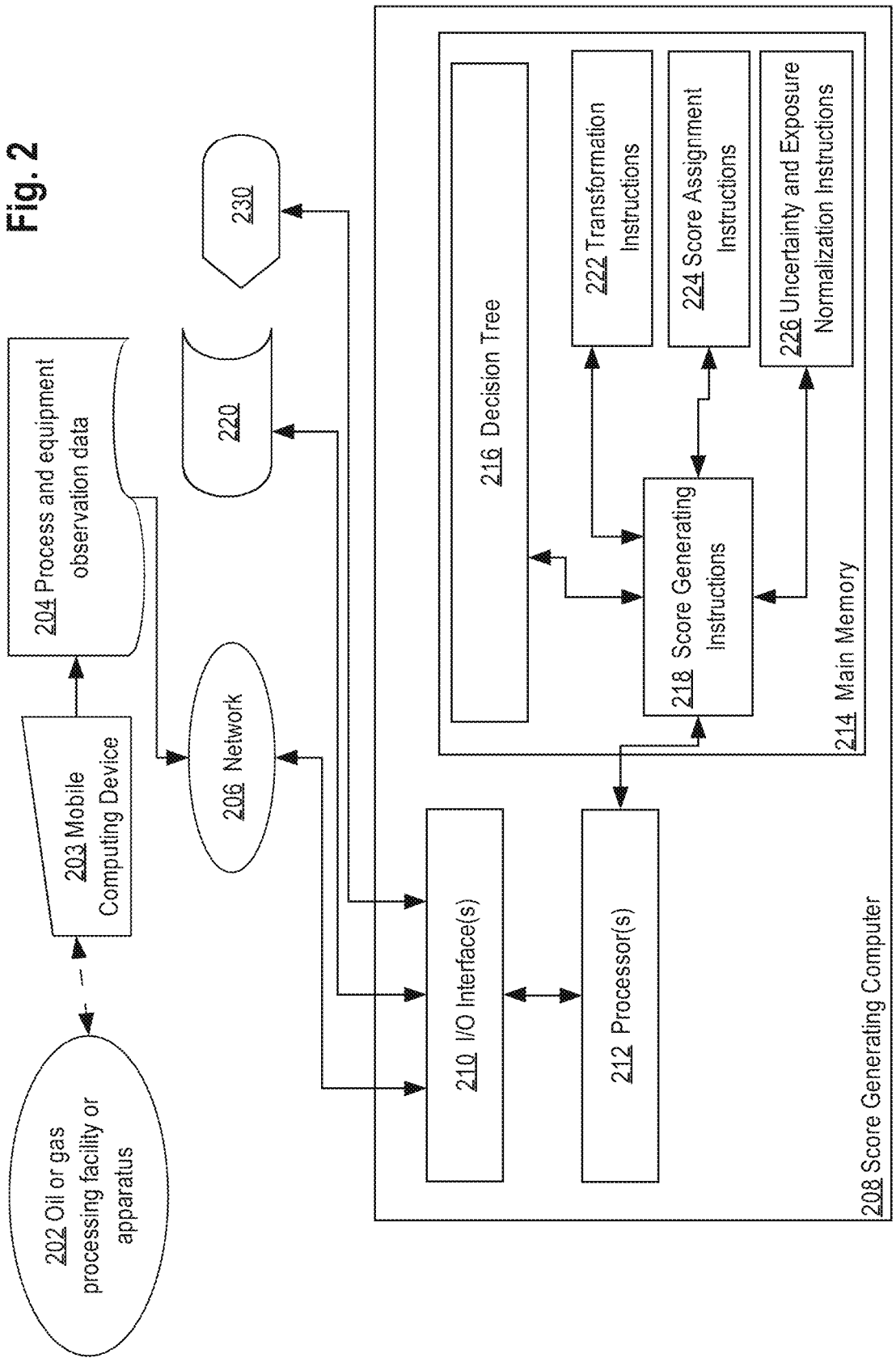
FIG. 2 illustrates a networked computer system with which an embodiment may be used.

FIG. 1A, FIG. 1B, FIG. 1C illustrates an example algorithm that may be implemented using one or more computer programs to implement an embodiment. FIG. 2 illustrates a networked computer system with which an embodiment may be used. Referring first to FIG. 1A, FIG. 1B, FIG. 1C, in one embodiment, a data processing method is provided for execution using a programmed computer to generate a normalized and objective digitally stored score value specifying estimated performance of an oil processing operation or gas processing operation, in which the score value represents an estimated impact of the oil or gas processing operations across a diverse set of problems and represents technical uncertainty and operation uncertainty, as seen at block 102. Each of FIG. 1A, FIG. 1B, FIG. 1C FIG. 2 depicts a method or programming algorithm for identifying one or more listings in a data cache that may contain invalid data and related listings in the data cache that may also contain invalid data. FIG. 1A, FIG. 1B, FIG. 1C, and each other method diagram or flow diagram in this disclosure, is intended to describe an algorithm, process or other outline for how the functions shown in the drawing figure may be implemented in programming instructions for a computer. Any suitable programming language or development environment may be used such as JAVA, OBJECTIVE-C, C++, scripting languages, and the like. In practice, an implementation or embodiment will include program instructions for many steps other than those shown in the drawing figures, but FIG. 1A, FIG. 1B, FIG. 1C, and each other method diagram or flow diagram in this disclosure, nevertheless indicate the algorithmic information that the inventors have deemed sufficient to communicate to a skilled programmer or software engineer how to implement the specified functions in complete working code.

"Impact," in this context, refers to a benefit in relation to safety, health, production efficiency or economics. The score value is generated in an absence of data used to train an algorithm. The method comprises creating and storing, in computer memory, data representing a multiway decision tree, as seen at block 104, and representing a plurality of oil processing execution techniques or gas processing execution techniques as leaf nodes as seen at block 106, a plurality of base evaluation criteria as a plurality of levels of intermediate root nodes as seen at block 108. Each of the intermediate nodes is coupled to a specified discrete plurality of the leaf nodes, as seen at block 110, and a single final evaluation criteria root node is coupled to those intermediate root nodes that are in a highest level among the plurality of levels, as noted at block 112. As shown at block 114, the leaf nodes are configured to store a plurality of execution technique data values each respectively associated with a different evaluation criterion of an oil processing environment or a natural gas processing environment.

At block 106, the process may be programmed for receiving a plurality of process and equipment observation data representing a plurality of observations of processes performed in an oil extraction apparatus or a natural gas extraction apparatus. Data at block 106 may be received in digital form from field representatives and communicated from remote computers in the field via wireless and/or wireline networks to a server computer for further processing as described below and in relation to FIG. 2.

Referring now to FIG. 1B, block 118, the process further comprises transforming each process observation datum into a base evaluation criterion score value selected from among a continuum of score values, and optionally one or more of: applying a first uncertainty coefficient to the base evaluation score value (block 120), or applying an exposure coefficient to the base evaluation score value (block 122). As seen at block 124, the transforming is repeated for all the process observation data to result in storing a plurality of base evaluation criteria score values in memory. In one embodiment, the uncertainty coefficient is applied only at the base evaluation criterion level at a leaf node level in the decision tree. In this way the uncertainty coefficient may be used to record that a particular technique is not applicable, less effective or particularly important in the technical environment at hand. Exposure may be applied again at a theme level, and normally not at all intermediate levels, for conditions or practices that are important.

At block 126 the method further comprises walking the decision tree and assigning, to each one of the leaf nodes, one of the base evaluation criteria score values and repeating the assignment until all leaf nodes have base evaluation criteria score values assigned. One of the assigned values may be a "no record" value.

At block 128, the method further comprises assigning, to each of the intermediate root nodes, an intermediate evaluation criteria score value by applying one or more dimensionality reductions to a combination of all base evaluation criteria score values of the leaf nodes to which each of the intermediate root nodes is respectively coupled. As indicated at block 130, optionally the process may perform and one or more of: applying a second uncertainty coefficient to the combination, and applying a second exposure normalization coefficient to the combination.

At block 132, the method further comprises combining the intermediate evaluation criteria score values of all intermediate root nodes of a particular level into a combined level evaluation criteria score value. At block 134, the combined level evaluation criteria score value is assigned to one of the intermediate root nodes at a next higher level among the plurality of levels, and the process is repeated for all the levels as indicated by arrow 136.

Referring now to FIG. 1C, at block 138, the method further comprises generating a final expected impact value based upon combining the combined level evaluation criteria score values of all the intermediate root nodes to which the single final evaluation criteria root node is coupled.

Turning to FIG. 2, in one embodiment an oil or gas processing facility or apparatus 202 is a source of process and equipment observation data 204, which may be collected using a computing device 203 or other computer in a field location near the facility or apparatus 202. The computing device 203 broadly represents any smartphone, tablet computer, laptop computer, desktop computer or other computer that is capable of hosting an application program, spreadsheet, database or other data entry facility in proximity to the facility or apparatus 202. Data 204 may represent field observations obtained by individuals at the facility or apparatus 202 and entered into the computing device 203 in the field using a graphical user interface and stored using a database managed by a dedicated application program that is customized to accept data entry for this purpose. Alternatively or additionally the field personnel may use a spreadsheet, database, or other general-purpose application to record the data 204 with computing device 203 using a specified template, format or schema that is programmed into the spreadsheet, database or other application.

The data 204 is communicated digitally via a network 206 to a score generating computer 208. Network 206 broadly represents any combination of one or more local networks, wide area networks, internetworks or internets. The score generating computer 208 is coupled to the network 206, a storage unit 220 and a display 230 via I/O interfaces 210. The score generating computer 208 further comprises one or more processors 212 coupled to main memory 214 which stores a decision tree 216, score generating instructions 218, transformation instructions 222, score assignment instructions 224, uncertainty and exposure normalization instructions 226. In one embodiment, the score generating instructions 218, transformation instructions 222, score assignment instructions 224, uncertainty and exposure normalization instructions 226 represent functional modules of one or more computer programs that are stored in the main memory 214 and executed using the one or more processors 212 to cause performing the functions that are described further herein. Main memory 214 also comprises pages or regions that are configured to store the decision tree 216 and such variables, constants and other values as are described herein or otherwise useful to support the functions that are described.

Storage unit 220 may comprise network attached storage, cloud storage, or one or more disk drives or arrays that are locally coupled to the score generating computer 208. In one embodiment, storage unit 220 hosts a database that stores score values for line items associated with base evaluation criteria, intermediate nodes, and root nodes in a decision tree of the type further described herein. The database may be configured to store these values, as well as raw data reports of field assessments received from the computing device 203, in one or more database tables or in flat files. The database may be configured as a multi-tenant shared database system in which data associated with different oil or gas facilities is associated with an entity identifier so that separate scoring, reports and analysis may be performed for different entities, such as different energy producers or operators. In this manner, the computer 208 may be configured for use by a score service provider having a service provider-customer relationship with a plurality of different energy producers, operators or managers that act as customers of the service provider, which provides scores or other data analysis to them.

Display 230 may comprise an LCD panel display, touchscreen, or other visual output device that the score generating computer 208 can drive via device driver hardware and under control of display memory and/or a software presentation layer that may be implemented using the score generating instructions 218.

For purposes of illustrating a clear example, a single instance of computing device 203, data 204, computer 208, data storage unit 220 and display 230 are shown in FIG. 2, but in other embodiments, any number of these elements may be used. Computer 208 may be implemented using a desktop computer, laptop computer, workstation, one or more virtual machines hosted in one or more physical machines, or one or more instances of computing resources in a virtual data center or cloud computing service.

3.1 Base Evaluation Criteria

To enable machine determination of a flexible score that can be normalized, in an embodiment, a decision tree is created and stored in computer memory with lowest-level nodes that are associated with base evaluation criteria. "Base evaluation criteria," in this context, refers to characteristics of an oil processing apparatus or gas processing apparatus, such as a well, other oilfield equipment or processing apparatus or installations, that pertain to safety, efficiency, economics or other performance or evaluation factors. When properly scored using the computer-implemented functions that are described herein, these evaluation criteria can lead to a score for the apparatus or facility that measures the quality of the apparatus or facility in relation to objective standards of quality that have been determined by an evaluating organization. Thus, in practice, the computers and processes described herein typically will be implemented and used by a third party quality assessment organization, or scoring organization, but other embodiments may be used by energy producers, regulatory agencies, municipalities, non-government organizations, and/or any other entity or person that desires to score an energy facility, apparatus or installation.

Figure 3:
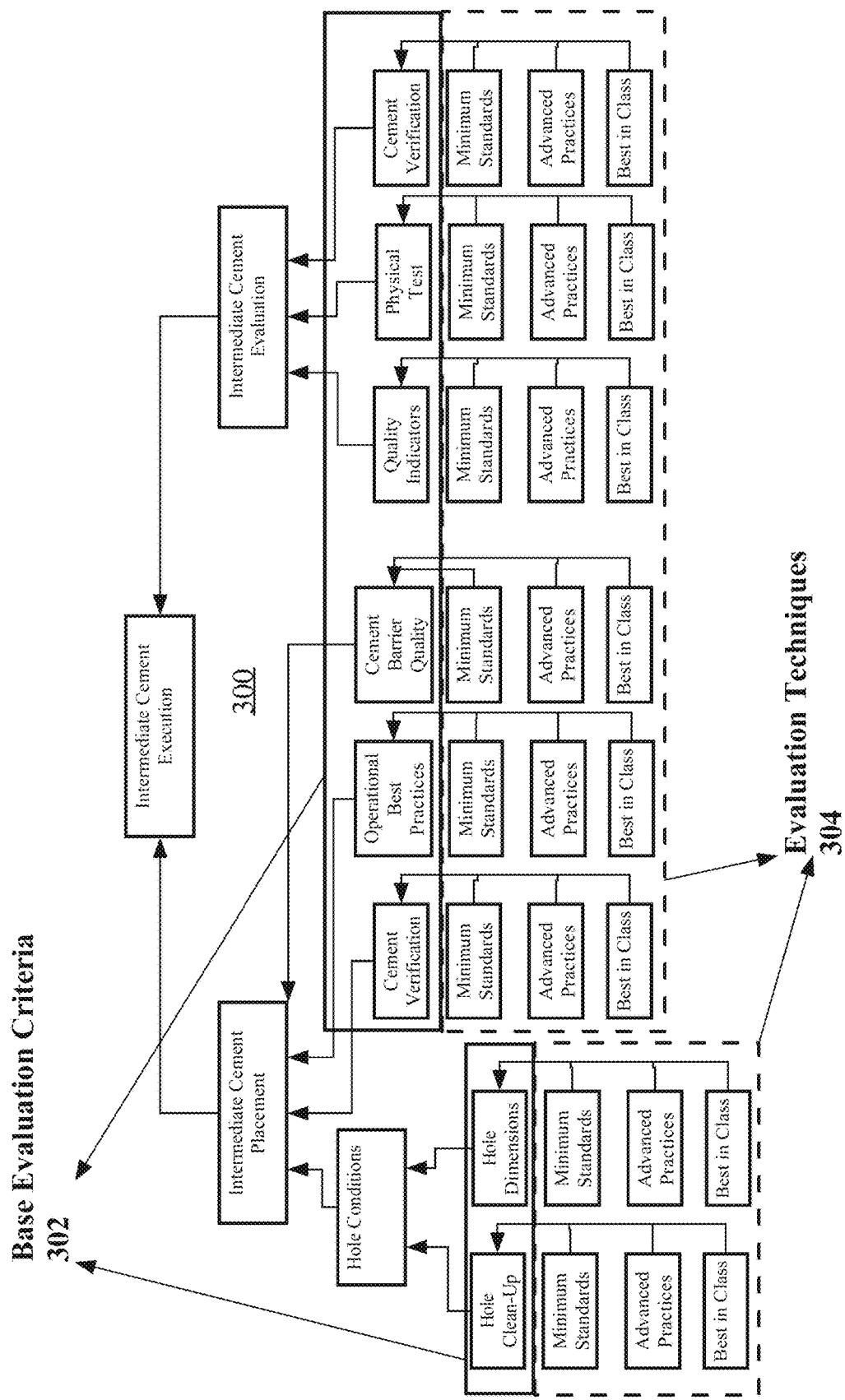
FIG. 3 illustrates an example decision tree branch pertaining to intermediate cement evaluation.

FIG. 3 illustrates an example decision tree branch 300 pertaining to intermediate cement evaluation. Cement installation is a conventional feature of well downhole construction. Branch 300, which may form part of a larger decision tree, comprises a plurality of nodes that may be created and stored in computer memory, or in persistent storage in the form of a database, flat file, or other digital data representation.

A first plurality of nodes comprises base evaluation criteria 302. In an embodiment, the base evaluation criteria define the lowest level of the decision tree that is applicable across exposures. Example base evaluation criteria include "hole clean-up," "hole dimensions," "cement barrier quality," and so forth. The level or quality of execution of each such criterion contributes to a score of intermediate cement evaluation, and ultimately to an overall score for the facility. In one embodiment, each base evaluation criterion satisfies a specified test, which can be applied to future candidate base evaluation criterion to determine if they qualify and can be added to the decision tree. In one embodiment, the base evaluation criteria represents performance goals such as "hole quality," which is a measure of how well a drilled hole has been cleaned up, or "cement formulation," which is a measure of quality and optimization of a cement blend.

Each of the base evaluation criteria is associated with one or more execution techniques. For example, "hole clean-up" may be associated with execution techniques representing "minimum standards," "advanced practices," or "best in class" techniques. All sub-groups of execution techniques 304 within each base evaluation criteria may be represented in a tree portion such as tree 300 of FIG. 3 using a second plurality of nodes that are linked to the base evaluation criteria 302. Further, in an embodiment, each execution technique—such as "minimum standards"—represents and is associated with a plurality of stored line items, each of which may be marked or identified in the field as completed, available, or implemented either using a binary YES-NO value or a scalar numeric value.

Thus the execution techniques represented in the base evaluation criteria comprise a comprehensive and continuously growing aggregation of all ways, of varying quality, to satisfy the base evaluation criteria. For purposes of presentation and organization, the execution techniques may be grouped into buckets below a base evaluation criterion; however, these buckets must be scored similarly to all items that are below the base evaluation scoring criteria, because they may be mutually exclusive, or carry different weights in different exposures.

The individual definitions of the base evaluation criteria may change as the system is populated and developed. For example, when a new process is added, one level may have been defined too high or one level may be too low; correction is not required and the existing definitions enable the system to be flexible.

The foregoing data structure forms a clear divide between data representing specific techniques and processes that are below the base evaluation criteria, and data representing abstract concepts that are above the base evaluation criteria. Computer implementation of a decision tree with this form of division permits scoring techniques and concepts in fundamentally different ways. When the base evaluation criteria are properly defined, the system retains flexibility to define all items above and below this level separately without concern for interdependencies, simplifying scoring operations.

FIG. 4 illustrates a high-level scoring structure. Example methods for scoring the two types of items is disused below in sections 3.2 and 3.3.

Because of the scale of the assessments that the present system permits, maintaining a clear distinction between base evaluation criteria, everything above and everything below is a fundamental component of the system architecture. Moreover, the separation proposed herein permits processing and creating a part of a decision tree without knowledge of the entire tree. In an embodiment, a part of a decision tree at the individual component level can be created and stored while ensuring the entire tree will interoperate as intended. In addition, the structure provides flexibility. For example, flexibility can be achieved by modifying the decision tree by adding or deleting a plurality of execution techniques that are associated with a particular one of the base evaluation criteria, and regenerating the final expected impact value based upon the same process and equipment observation data and re-performing the transforming, assigning, combining, and generating steps; and/or by modifying the decision tree by adding or deleting a plurality of the base evaluation criteria, and regenerating the final expected impact value based upon the same process and equipment observation data and re-performing the transforming, assigning, combining, and generating steps.

3.2 Scoring the Execution Techniques Associated with a Tree

In an embodiment, when a decision tree has been created in memory that complies with the base evaluation criteria rule set forth in section 3.1, the execution techniques 304 under each of the base evaluation criteria 302 can be scored. In an embodiment, scoring comprises transforming discrete process observations into a score along a continuum under program control using score generating instructions 218 of the score generating computer 208. An example score is a single number between 0-100, which is the continua. In an embodiment, a computer-executed algorithm calculates the quality with which the base evaluation criterion 302 was accomplished based on both the specific execution tasks which were completed and the quality with which they were completed. In one embodiment, transformation instructions 222 and score assignment instructions 224 are configured to cause the processors to perform the functions described in this section.

In one embodiment, transformation and scoring comprises using the computer to compute a sum or average that assigns a single point to each completed item in the evaluation techniques associated with the base evaluation criterion, and reduces the score to a percent completed out of 100. Thus, one transformation programmed using the transformation instructions 222 may comprise a linear dimensionality reduction executed via principal component analysis. This method does not consider interactions such as synergies or mutual exclusion, and does not weight the importance of different items, but is simple and easy to add new methods to the list.

Alternatively, non-linear methods may be used to map the data with correlations.

Additionally, the accuracy of linear dimensionality reduction can be improved via a weighted average or weighted sum that recognizes the relative importance of different line items. This method introduces non-linear dimensional reductions, but does not account for relationships between items such as synergies and mutual exclusion. This method is slightly more complicated to update due to the requirement to re-adjust weights every time an item is added.

Still another embodiment defines multi-dimensional equations that describe the weighting and interdependencies of all the line items, providing a scoring algorithm that is capable of properly combining all observations. Combining two items and thus executing using two dimensions, the equation yields a mathematical surface in which the Z dimension is the score. However, if more dimensions are added, then this concept becomes challenging to visualize. While this method has the greatest potential for accuracy, defining these equations is challenging as the number of dimensions increases. In one embodiment, the HiScore algorithm may be used to fit a multi-dimensional equation to pre-defined points. The HiScore algorithm is described at the time of this writing in online documents in the folder/aothman/hiscore at the domain github.com. This process greatly simplifies the process of creating these equations but above three or four dimensions this process also becomes challenging.

Therefore, at least three different solution methods may be used in different embodiments, each with a tradeoff between the ability to represent reality, which may or may not be realized due to complexity, and the complexity of the method. Increased complexity makes the addition of new techniques challenging, and as complexity increases, can even make the initial definitions challenging, if not impossible.

The foregoing has reviewed dimensionality reduction, but has not addressed the values for the subject data elements. In various embodiments, the execution methods represented as line items in the execution techniques have binary (YES or NO) inputs, and others receive "partial credit" as an evaluation of execution quality. These value assessments are preferable as they increase the accuracy and capability of the scoring system. However, in order to assure objectivity, a combination of YES or NO answers may be preferable to a single value assessment. Therefore, in one embodiment, to convert process observations into points on a continuum the score generating instructions 218 are programmed to assess the execution quality of each element or line item, and to perform a dimensionality reduction on process observations in a way that closely mimics reality but is not so complex that it is difficult to define, and not so complex as to make system expansion impractical.

CALCULATING EXECUTION QUALITY. In one embodiment, to calculate execution quality, the system is programmed to assign quality characteristics to positions on the continua. That is, in each execution technique, each of the line items may have a specified execution quality, and that execution quality may be mapped to a position in a continuum. For example, in one embodiment, 90-100 is representative of "best in class performance," which is one level of execution quality, 80-90 maps to an execution quality of "top quartile performance," 70-80 maps to "second quartile performance," 60-70 maps to "average" execution quality, and below 50 maps to "bottom quartile" execution quality. These positions serve as a guide to objectively assign quality values and verify the algorithms. As a specific example, a field representative might enter data indicating that one aspect of concrete installation was observed to be of "average" execution quality; that line item would be assigned a value of "65" on the continuum for purposes of later score aggregation or contribution, and that line item would represent just one of plurality of execution techniques associated with a particular base evaluation criterion. In this manner, transforming each process observation datum into the base evaluation criterion score value may comprise mapping a plurality of different discrete sets of the execution techniques to a respective plurality of different value ranges in the continuum.

MUTUALLY EXCLUSIVE QUALITY. Field observation may also involve recording and reporting data for values that are mutually exclusive, to prevent the introduction of contradictory data that could not be accurately resolved into a score. FIG. 5 illustrates an example of selecting quality in a situation in which values are mutually exclusive. In one embodiment, if quality is determined by which method from a list of acceptable methods was used, then the value of each option is determined based on the foregoing guides, and the assessor may select a single option, for example, using a dropdown widget in a graphical user interface of the computer display.

FIG. 5 illustrates an example portion 500 of a graphical user interface of a data entry application program, in which the base evaluation criteria is Zonal Isolation Design 502, and a plurality of techniques 504 include Aquifer Identification 506. The graphical user interface may be presented at computing device 203 using an application program, or may represent a spreadsheet application that has been programmed with a constrained data entry configuration.

For this technique, a dropdown widget 508 presents choices of None, Standard, Analog Experience, and Verified In-hole, each with different discrete score values. In an embodiment, an initial intuition-based score selection, such as Aquifer Identification, serves as a tool to ensure score quality, and new line items may be filled in between the initial scored items among the techniques 504. Real data is later used to benchmark the prevalence of these items and adjust ranges accordingly. However, the system is never based entirely on actual practices to enable theoretical best practices to encourage better performance if no operators meet this level.

MEASURABLE QUANTITIES. If a process can be reduced to an integer, real number or representation of a fraction, such as the ratio of actual cement strength or required cement strength, which serves as a measurement of conservativeness or numbers of bottoms up circulated in a hole clean-up operation which serves as a measure of likelihood of cement success, then the numeric value is recorded and stored. Such values are mapped to a position on the continuum similarly to the specific processes as described above; stored mapping tables, mapping functions that rely on stored mappings, or mapping functions that dynamically compute a mapping of an integer, real number, or representation of a fraction or ratio may be used to yield a position value on a specified continuum.

FIG. 6 illustrates an example of value assessment in which numerical values yield a score via an equation. In the example of FIG. 6, a base evaluation criterion is "Safety Factors" 602, the evaluation technique is "Minimum Standards", and a plurality of line items 604 each accept a response of the type indicated in column 606; for example, one response type is "YES-NO-NO RESPONSE" and a second response type is "Value," where the latter may be a real number. In an embodiment, a mapping function computes an arithmetic mean of the numeric response values, and maps that mean value to a performance score on the continuum according to a mapping function represented in graph 610. The ranges of values that the mapping functions accept, or that the mapping tables reflect, can be adjusted in a similar fashion as more data is brought in.

COMBINATORY QUALITY. In some instances, the best way to assess quality is using a series of questions with YES or NO answers, such as: Was the pipe reciprocated? Was centralization installed? Was the hole cleaned? Each such question may be a line item for a particular execution quality of a particular base evaluation criterion. Each specific combination of these answers results in or maps to a score on the continuum, such as an integer between 0 and 100. This is a discrete dimensionality reduction at one level lower than discussed earlier, and may be solved in the same way as described in the next section.

DIMENSIONALITY REDUCTION. In a dimensionality reduction of the type previously described, all elements may be given a score between 0 and 100. YES or NO answers are given a score of either 0 or 100. Elements based on YES or NO answers necessarily have limited score variation unless there is a large number of YES or NO answers, but this may be addressed using relative weighting at higher levels. For example, if there is only 1 YES or NO question in "Hole Evaluation," then the response indicates that a subject has either done everything possible for hole evaluation or has done nothing. Embodiments may be programmed so that the resulting score of 100 or 0 for hole evaluation is not averaged with other components to avoid having disparate impact on a score.

Figure 7:
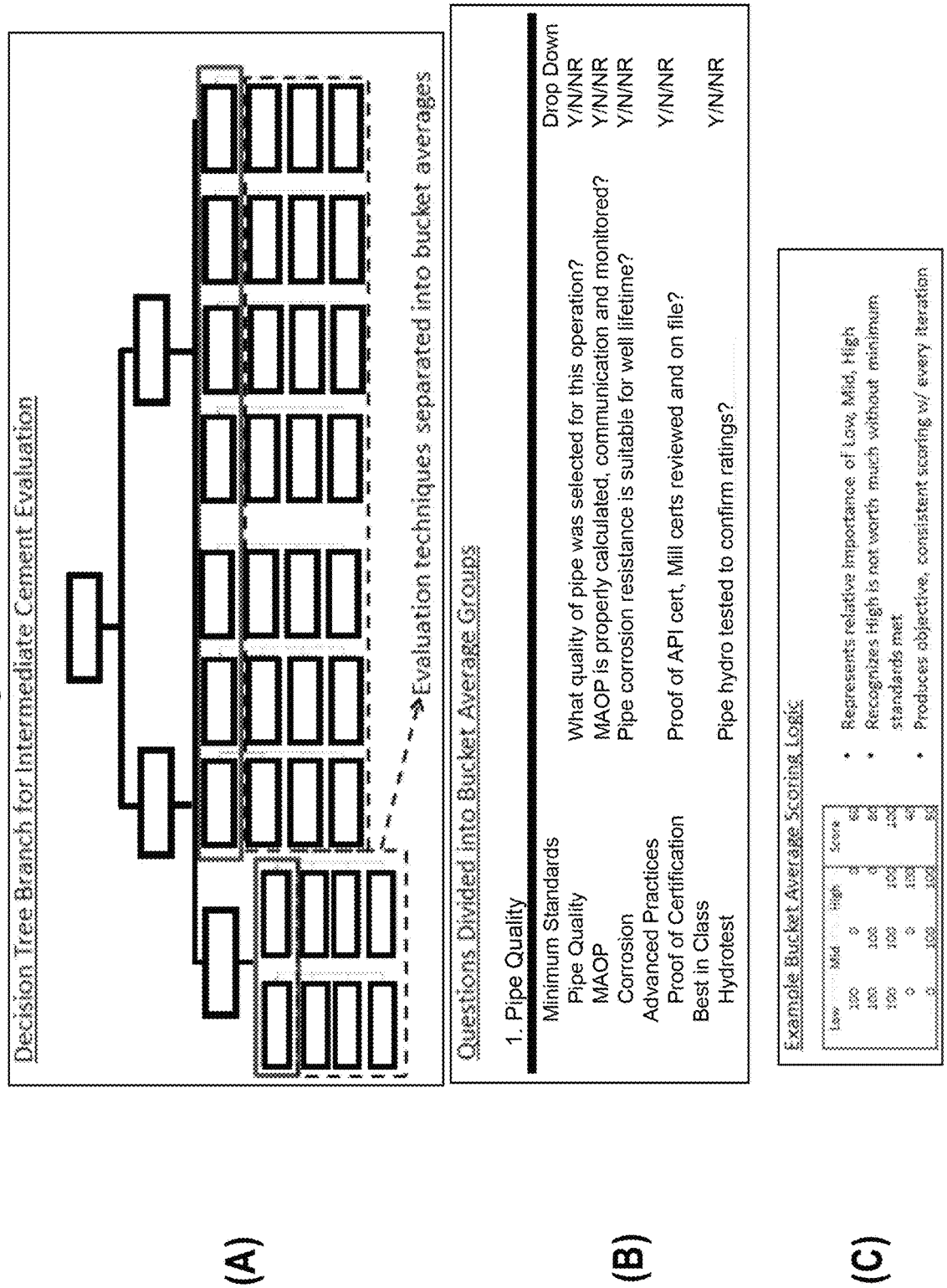
FIG. 7 is a three-part illustration of techniques for using bucket logic to determine scores for evaluation techniques.

To preserve input flexibility and operation practicality, while closely matching reality, the system may use a combination of linear and non-linear methods for bucket averaging. FIG. 7 is a three-part illustration of techniques for using bucket logic to determine scores for evaluation techniques. Part (A) of FIG. 7 illustrates a portion of a decision tree branch, pertaining to intermediate cement evaluation, in which different evaluation techniques are separated into bucket averages. Part (B) of FIG. 7 illustrates questions divided into bucket average groups. In one embodiment, most elements are modeled with three buckets denoted High, Mid, and Low. Part (C) of FIG. 7 illustrates a decision table that may be embodied in programming to determine a score based on individual bucket score values for Low, Mid and High buckets.

In special cases different buckets can be defined with appropriate programming support. The execution quality assessment and exposure assessment mechanisms provided herein eliminate non-relevant and mutually exclusive items, so that all remaining items are relevant. However, predetermined algorithms are not used, to preserve the flexibility to add and remove components depending on exposure or other factors. In one embodiment, rather than use fixed algorithms, items are grouped into relative importance categories with predetermined relations and use an average within that category. In application, the minimum expected requirements are assessed in the low box, advanced techniques are assessed in the mid box, and best-in-class techniques are assessed in the high box. This provides structural control in the programming, by ensuring that the most points from basic practices are captured, while allowing addition and exposure modification, without having to re-write algorithmic relations for each new assessment. More buckets can be created to allow a more nuanced assessment, but the breath of the assessment permitted in the present system is believed to provide adequate differentiation from depth in any particular category.

3.3 Scoring Relative and Interrelated Performance

Scoring relative and interrelated performance refers to programmed steps that implement a series of dimensionality reductions as scores are propagated up the decision tree. In an embodiment, transformation instructions 222 and score assignment instructions 224 may be programmed as described herein to perform the reductions and propagate the scores through the decision tree, assigning scores to intermediate nodes at successively higher levels of the decision tree until the root nodes are reached. In an embodiment, each dimensional reduction is a programmed function to combine a number of abstract concepts that have been scored on a 0-100 scale of execution quality. Additionally, since all structural flexibility is managed below the base evaluation criteria, the system can predefine all relationships because they are all important in each scenario.

Certain reductions are straightforward; for example, the top-level evaluation criteria of Air, Land, Water and Community are all given equal weight in calculating a final score value, and combined using an arithmetic average. Other reductions are more complicated and require more advanced assessment methodologies. For example, reductions pertaining to cement quality are programmed so that high quality operational practices are most important, and in their absence, even if everything else is done perfectly, the score will suffer; they are also programmed so that if cement is executed perfectly with a large safety margin and all indicators are positive, then cement evaluation is not critical, and not required for solid performance. However, it will be necessary to gain the extra points needed for top quartile performance.

FIG. 8 illustrates an example scoring table that can be used as the basis of programmed logic for performing a multi-criteria score reduction for propagation upward to a cementing node. In the example of FIG. 8, an intermediate node denoted "Cementing" is associated with four (4) subordinate base evaluation criteria denoted Cement Design, Cement Placement, Operational Indicators, and Evaluation, as indicated by column headings in the table. Rows of the table represent alternative scoring results for different facilities, and the Score column represents a post-reduction score for Cementing that is determined, using programmed instructions, based on the individual scores for each of the four (4) base evaluation criteria shown in a particular row.

The first row indicates that if all four (4) evaluation criteria have been scored "100," then the reduction function will determine a Cementing score of "100" for the combination of those evaluation criteria; similarly, the third row indicates that scores of "80" for every criteria will yield a reduced score of "80". The second row indicates that if all evaluation criteria have scored "0", then the Cementing score will be "0". The fourth, fifth and sixth rows are more nuanced and indicate that different individual base evaluation criteria can have a significant effect, or a minor effect, on the ultimate reduced score value for Cementing. Thus the table uses individual score values, combined into a final score, in a manner that recognizes the relative importance of placement operations and gives credit for going above and beyond with multiple barriers.

Figure 9:
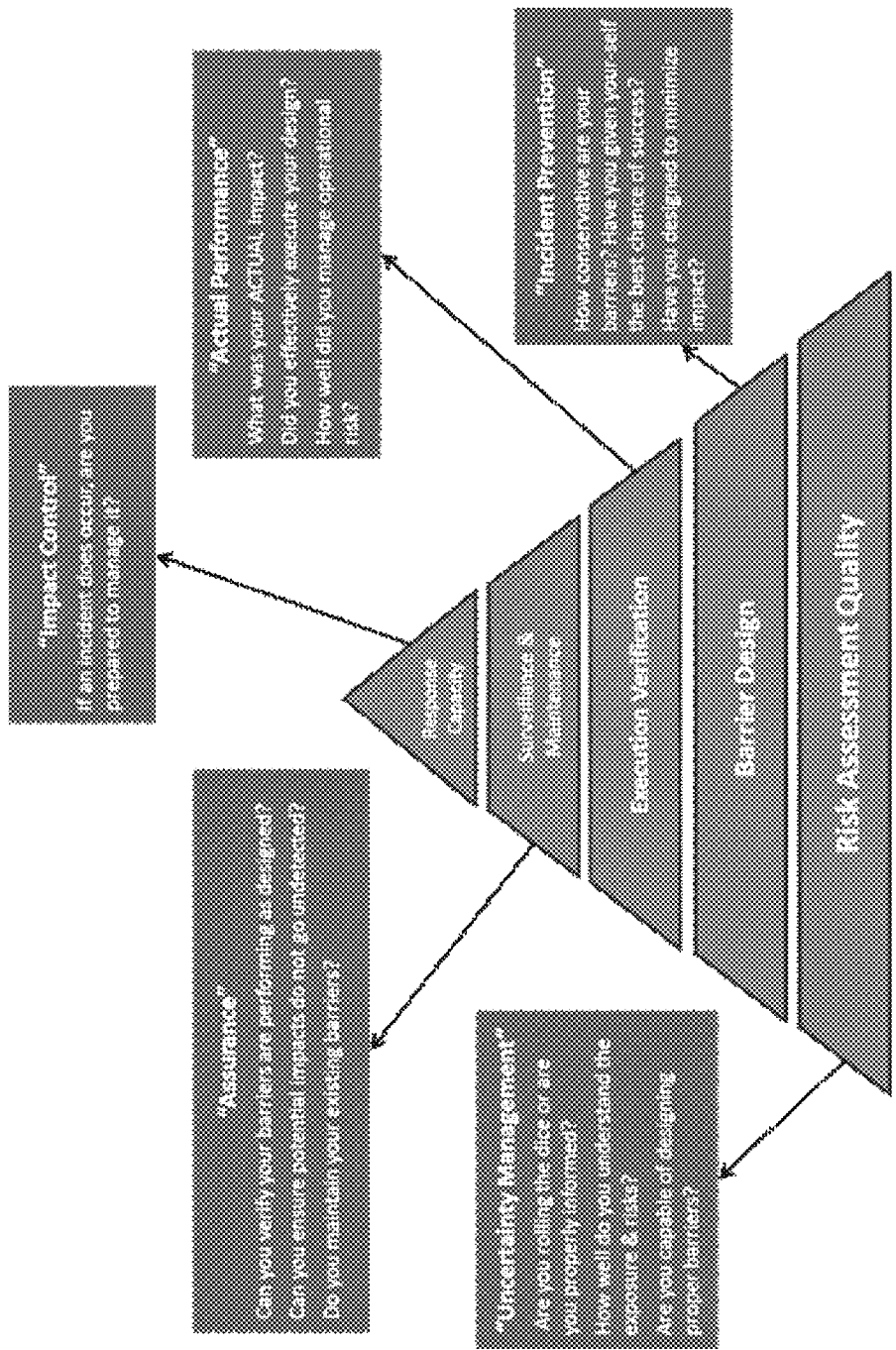
FIG. 9 illustrates a pyramid that represents principles of programming the system for different components contributing to a score and their relative importance.

In addition to the scoring functions that have been discussed in previous sections, in one embodiment, the system is programmed on the basis of a standard methodology to identify how to compare different components. FIG. 9 illustrates a pyramid that represents principles of programming the system for different components contributing to a score and their relative importance. If the base components are not accomplished successfully, then the score will not be able to exceed minimum standards, however even with perfect execution of the base components, an operator cannot achieve top level performance without a mastery over the supporting components.

3.4 Uncertainty Management

In an embodiment, the system is programmed with uncertainty management operations. Uncertainty management effectively addresses the large number of inputs to the system, which reflect a vast span of acquisition cost and information availability. In an embodiment, the uncertainty management programming allows the system to produce an assessment based on widely varying input sources and properly price the resulting level of certainty. In one embodiment, the uncertainty management system has four components: a method of displaying or communicating and processing uncertainty; a method of assigning and processing uncertainties at entry elements; a method of structuring scoring to manage different uncertainty levels and price certainty; a method of propagating uncertainty through a decision tree so that final score is representative of the uncertainty of all its parts.

COMMUNICATING AND PROCESSING UNCERTAINTY. In past systems uncertainty has typically been ignored on the rationale that "if you can't prove it, it didn't happen." This approach severely limits an assessment capability. A marginal improvement is to choose the best and worst possible outcome and run the score twice, thereby bracketing all potential outcomes. That approach can be useful if the resulting band is small so that uncertainty is not critical. However, in most cases the result is a wide band with no understanding of the likelihood of extremes, which wipes out any comparison value, because the system no longer can differentiate scores between different operators. Additionally, it is hard to express this score because it is comprises a high value and a low value with no other information. Neither of these limitations is acceptable under the constraints described above.

Instead, in an embodiment, uncertainty and exposure normalization instructions 226 (FIG. 2) are programmed to implement the steps of FIG. 1A, FIG. 1B, FIG. 1C, and the functions described herein relating to applying an uncertainty coefficient to the score values. Using these instructions, uncertainty is represented in digital data storage unit 220 as a distribution in which each possible score is assigned a probability of occurrence and all the probabilities add up to 1. When visualized in a graph, the distribution peak is centered at the most likely score, but the tails in either direction are representative of how certain that assessment is.

At the most fundamental level, uncertainty management in the present system means that when the system receives a response value for an execution technique, coupled with a confidence level, rather than propagate the exact response value upward in the decision tree, the system is programmed to propagate a distribution of possible response values based on the confidence level, so that intermediate nodes and other decision tree levels can select from the distribution. This approach permits propagating the inherent uncertainty reflected in some response levels to higher nodes in the system.

Figure 10:
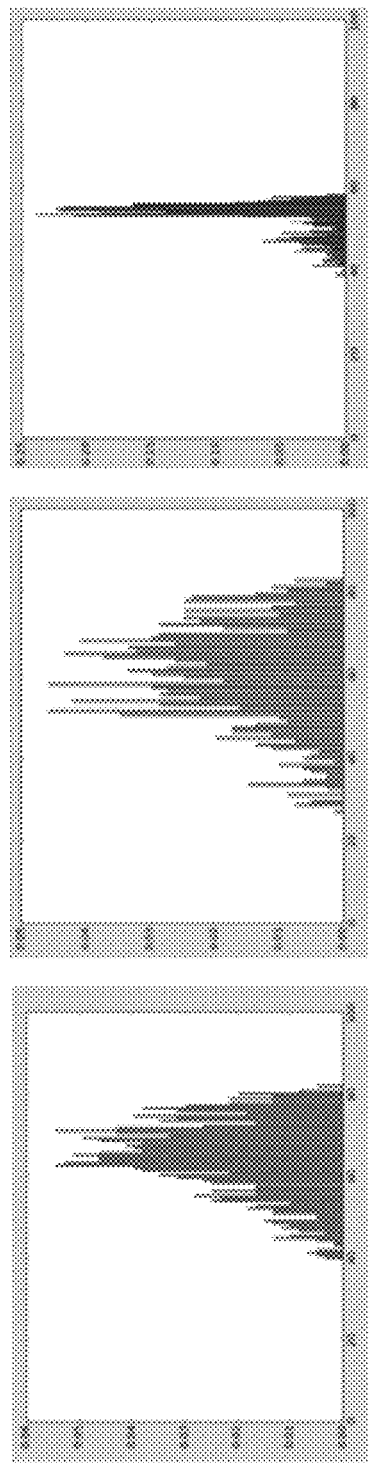
FIG. 10 illustrates a plurality of distributions of data in which different uncertainty values have been applied.

FIG. 10 illustrates a plurality of distributions of data in which different uncertainty values have been applied. This approach allows the present system of assessment to realistically and objectively represent reality and differentiate between operations even with limited information. A score may be expressed as a predetermined point in the distribution such as P50, P90, etc.

DATA ENTRY. With the distribution framework developed, the system can objectively determine and update the database at data storage unit 220 with an uncertainty modifier. A confidence framework based on data source and quality permits entering an uncertainty modifier as user input. For example, an execution technique representing a plan can deliver different levels of certainty depending on if this is a novel concept or an ingrained process. The assessor may first select a GUI widget specifying that their evidence came from a plan, and then may enter a value indicating their level of confidence in the data based on standard options (Novel, Demonstrated, Engrained, etc.)

Figure 11:
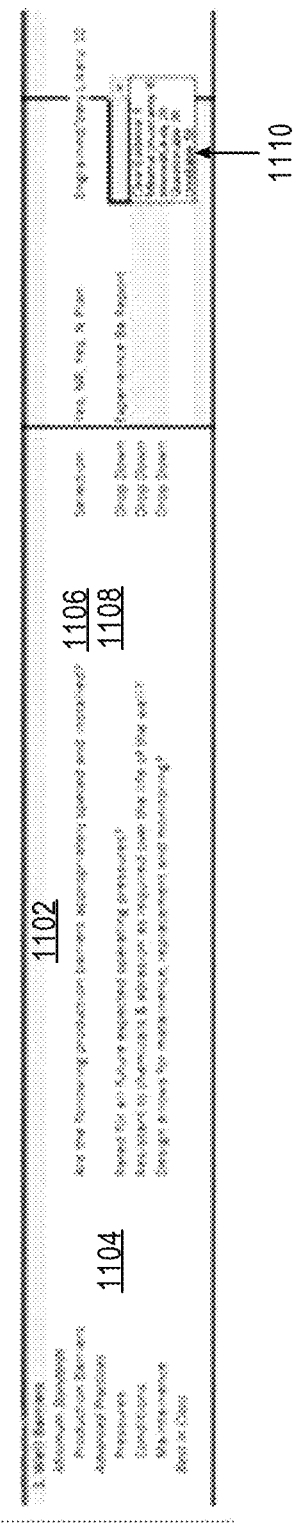
FIG. 11 illustrates a portion of a graphical user interface comprising a plurality of lines corresponding to standards and practices for well barriers.

FIG. 11 illustrates a portion of a graphical user interface 1102 comprising a plurality of lines 1104 corresponding to standards and practices for well barriers. A particular line 1106 relating to production barriers has been entered with a confidence option of Engrained/Very Likely, corresponding to a confidence value of "20". A second line 1108 for a different practice is partly entered showing a drop-down widget 1110 with options for Clear Evidence, Minimal Uncertainty, Engrained-Very Likely, Questionable, and Unavailable. Each confidence value in the widget 1110 is associated with a different score value 0, 10, 20, 30, 50. Selecting one of the score values causes persistently storing the score value in the database in association with an identifier of the practice item.

Similarly, reports and field visits can also come in different qualities but usually higher certainties. A high quality report can provide enough detail to eliminate uncertainty, but so can physically observing a task, likely at a higher cost. The standard uncertainty number associated with data source and data quality selection is applied to the measurement according to the processing step below. These standard uncertainty numbers are initially based on intuition but can be improved in time through data collection.

DATA PROCESSING. With a response value, which may be a score, and an uncertainty modifier assigned to each execution technique, those information elements may be converted to a distribution, which can then be processed up the decision tree. This occurs in three ways.

Figure 12:
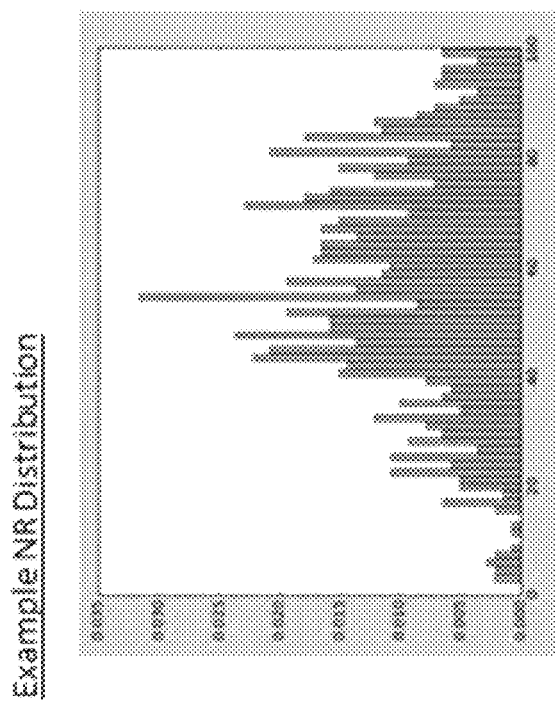
FIG. 12 illustrates an example "no record" distribution.

No Record. If there is no information for a particular execution technique on which to base a score, then a standard distribution value is created for that entry element. The score is designed around average performance in the 50-70 point range with a standard deviation of ~25 and truncated on the top end. Further, the goal of scoring performance is to express the score on a scale of 0-100. Therefore, in an embodiment, the system is programmed to add a standard "no record" and the associated element will have a distribution that is representative of all possible performance scores in industry. The lack of information will result in a large distribution and high maximum exposure, which will make it difficult to achieve an excellent rating, and will be uncomfortable to insurance providers; however, the entity's score will be comparable to their peers and not limited to only the low value. FIG. 12 illustrates an example "no record" distribution.

Continua or Value Response. In the situation where the response value for an execution technique is already on a continuous 0-100 scale, then creating a distribution is straightforward. For example, feet of cement may have been converted to a 0-100 scale already. As an example, assume that 300 ft of cement was reported, but confidence is only marginal, due to log and volume report quality. This combination of source and confidence is associated with a 30% certainty factor. In response, the system is programmed to create a distribution of possible cement heights that is centered at 300 ft, with a standard deviation of 90 ft (30%). Each possible height is converted to a score, and the element now has a score distribution for cement height. The user could have also marked 300 ft as the maximum likely value; in response, the algorithm would have placed 300 at one standard deviation above the mean, and calculated the score distribution using that cement feet distribution instead. Similarly, an input can be marked as the minimum expected.

Binary Response. Expanding the same logic to a binary response problem would result in a two bar distribution graph. For example, to answer the question "were centralizers run" with an answer of YES and a 30% certainty, the distribution would have 30% YES and 70% NO. While such a distribution is a literal interpretation of reality, it is not useful for combining with other distributions in the system, because it will result in odd shaped, "double mode" curves. By definition, scores should have a smooth distribution. Therefore, in an embodiment, the system is programmed to create a distribution that is centered at the statistical score. For example, if there is a 70% confidence in a YES answer, then rather than representing the score as 70 YES (100) and 30 NO (0), the score is centered at 70 with a standard deviation of 15. Similar to the processing of a No Record response, this approach is effective based upon the definition of a score, and since some information is available, the system can a smaller distribution around the likely score, so that even marginal information can increase the certainty of our score.

This approach rewards certainty when the subject is doing well, but it may also reward uncertainty when the subject is doing poorly. This is the nature of any benchmark for companies which are below average. Consequently, differentiation in below average companies is limited, but at this level, all performance can effectively be grouped into a "substandard" category.

STRUCTURING SCORING TO MANAGE DIFFERENT UNCERTAINTY LEVELS AND PRICE CERTAINTY. Embodiments may be programmed to accept different information sources with different certainty levels to answer the same questions. The system may be programmed, in one embodiment, to prefer the source with the highest certainty but also to process data values with less than the highest certainty due to cost, time, data availability or data quality constraints.

In an embodiment, different evaluation techniques can be connected to the base evaluation criteria using programming that selects the score that provides the highest certainty. For example, public data, Q or A, document review and field reviews can all be used to assess a company. If a public data review can only answer 50% of the questions, then the system is programmed to decrease the uncertainty in the total score; as a result, uncertainty may be reasonably high because these answers have uncertainty. Nevertheless, such an assessment may be useful for comparing the relative performance of companies based on public data.

Inherent in a distribution is a maximum exposure and expected exposure. For an end user in the business of insurance, this information can be directly used to price the value of extra work to reduce uncertainty. For example, if a field visit would cost $5,000 but would allow an insurance company to reduce their cash on hand by $500,000 due to increased certainty and reduced maximum exposure, then the extra cost is justified to free that capital for further investment.

For end users in other fields, certainty may be priced into the final score value by choosing a standard point on the distribution, say P70, for a particular final score. This method places both a quality and a certainty limit on a score, and represents a view of the value of confidence in the subject's performance. This method also encourages operators to keep good records and demonstrate good practices, but also allows them to control costs. If a higher score may result in maintaining a public license to operate, or if more confidence will win government incentives for an operator, then the increased certainty is properly priced. Similarly, investors can offer reduced rates of capital depending upon both score and certainty.

PROPAGATING UNCERTAINTY THROUGH A DECISION TREE SO THAT FINAL SCORE IS REPRESENTATIVE OF THE UNCERTAINTY OF ALL ITS PARTS. In an embodiment, the system is programmed to propagate the distributions, which result from assigning each entry element a confidence value, through the decision tree so that each element receives a score distribution. Combining elements through a Monte Carlo simulation, in which the combination is accomplished using the scoring system discussed above, will result in a shrinking distribution with each combination because the tails have a low probability, so that the probability of selecting a point from all tails in the same iteration is low. Therefore, every combination exercise shrinks the span of a distribution.

For example, assume a decision tree in which every entry element has been assigned a No Record distribution. When propagation reaches the top of the tree, the distribution will be very small, and centered on the No Record average. This may be the most likely outcome, but an interpretation of the output data is that the system is reporting that knowledge has been gained even though no information has been input, which is not acceptable.

Such output is not an accurate representation of reality because these decisions are linked. If an operator performs in the $90^{th}$ percentile in one category, then the operator is more likely to perform in the $90^{th}$ percentile in each of the other categories than a normal, random sample would suggest. This principle is similar to covariance, except that the mechanism causing variance is the same and can be modeled similarly for each decision. Therefore, in an embodiment, instead of a fixed covariance, the system is programmed to include a probability that these decisions are not always linked in the same way and in some instances they are not linked at all.

In an embodiment the system is programmed, for each base evaluation criteria or intermediate node, using a Monte Carlo simulation, to randomly select a value from the first element in the combination represented in the base evaluation criteria, and to calculate the percentile of this value. For each of the remaining elements in the combination the system selects a percentile from a normal distribution around the percentile which was randomly pulled from the first distribution. The system then pulls this value corresponding to the new percentile. Stated another way, the system is programmed for determining the second uncertainty coefficient referenced in the General Overview by:

for each particular base evaluation criteria associated with a particular intermediate node:

for a first execution technique thereof, pseudo-randomly selecting a sample value from the distribution, and determining a first percentile, in the distribution, of the sample value;

for each other execution technique of that base evaluation criteria, selecting a second percentile from a normal distribution around the first percentile, and selecting a second sample value corresponding to the second percentile;

using the first sample value and the second sample value to form a score for the particular base evaluation criteria.

In this way, the system is programmed to model that an operator who scored well in one category has a tendency to score well in a related category but this is not guaranteed.

Using this methodology, the system is programmed to run the same simulation discussed above with all No Record entries and the final distribution has the same average and standard deviation of the initial distributions. Therefore the level of uncertainty is preserved as the system moves up the tree and does not gain any knowledge that is not supported in the data.

Figure 13:
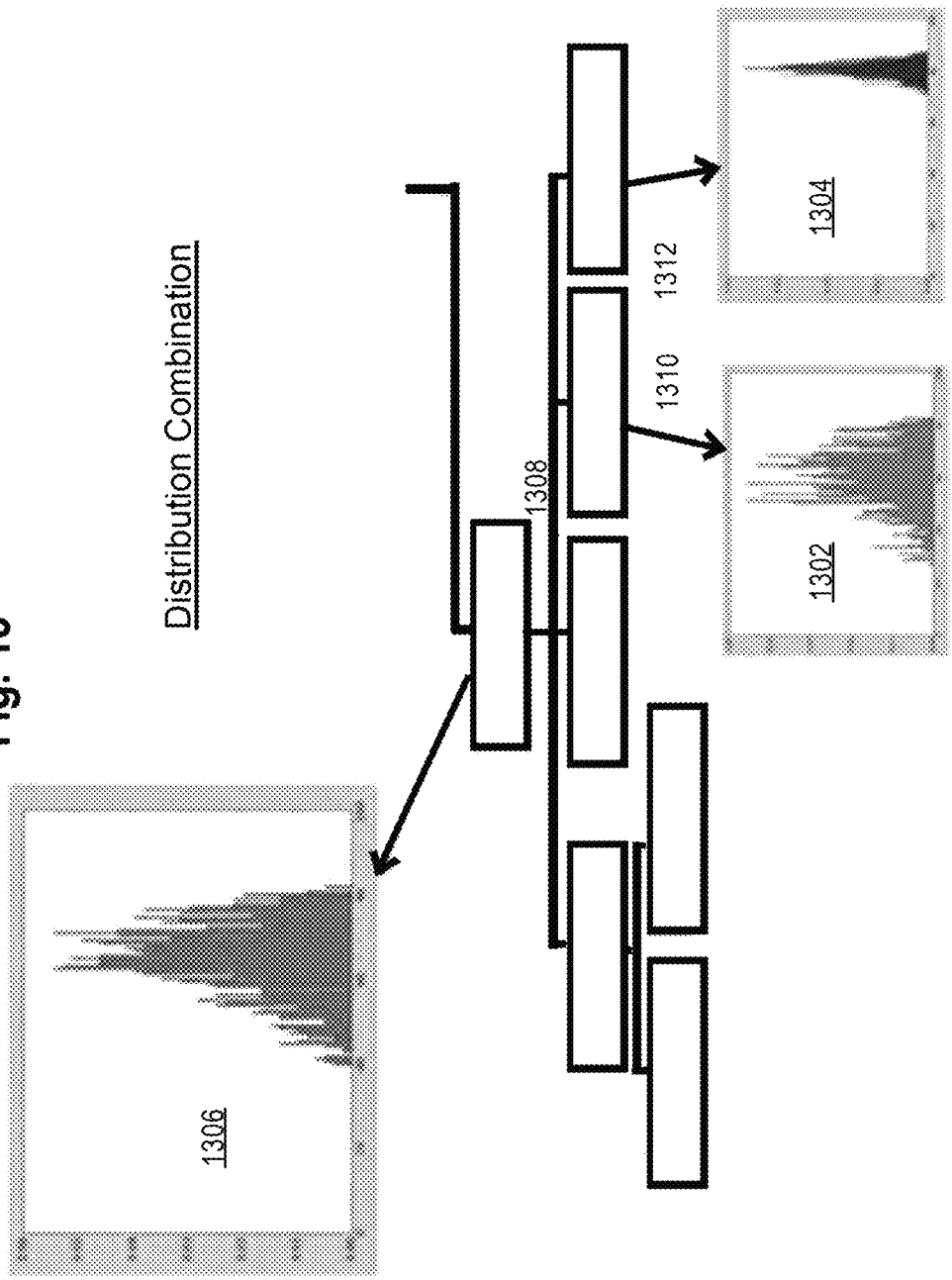
FIG. 13 illustrates an example of combining multiple distributions in a walk upwards through a decision tree.

FIG. 13 illustrates an example of combining multiple distributions in a walk upwards through a decision tree. In FIG. 13, a first distribution 1302 is associated with operational best practices for production cement placement at node 1310, and a second distribution 1304 is associated with cement barrier quality at node 1312. Nodes 1310, 1312 are base evaluation criteria. The two distributions 1302, 1304 are combined into the third distribution 1306 for the next higher intermediate node 1308 of the decision tree, denoted Production Cement Placement.

3.5 Flexible Scoring Framework

It will be apparent from the foregoing two sections that the system may be programmed with a flexible scoring framework. The flexibility inherent in the programming of the system enables it to grow and incorporate various exposures and environments. In an embodiment, the input structure is designed such that new items can easily be added to the correct categories and quickly integrated into the score. Exposure and environment flexibility also is achieved through modification of line items based on an exposure score.

3.6 Exposure Normalization

Uncertainty and exposure normalization instructions 226 also are configured to perform exposure normalization functions. Exposure is scored in a similar manner as performance and specific exposures are linked to specific performance criteria. For example, based on well depth and other criteria, which is assessed in exposure, the need for a third or additional casing string may be assessed. The weight of the third casing string is adjusted from "not required" to "very important" based on location criteria such as depth, HC zones, fracture gradient, or others. Engineers determine which line items should be affected by exposure and which exposure components should affect them. This knowledge base grows as the systems experience in different environment grows.

The specific exposure algorithm is programmed to compare an exposure score from items that have been tagged as influential to a performance score. If multiple exposure items have been tagged as influential, then their scores are averaged into a component exposure score. If Exposure Score=Performance Score, then Responsibility Score=Performance score. However, if performance does not match exposure, then performance score is adjusted. If Exposure Score>Performance Score, then Responsibility Score<Performance Score. The relationship between performance score, exposure and responsibility score can be displayed with the table shown in FIG. 14.

Figure 14:
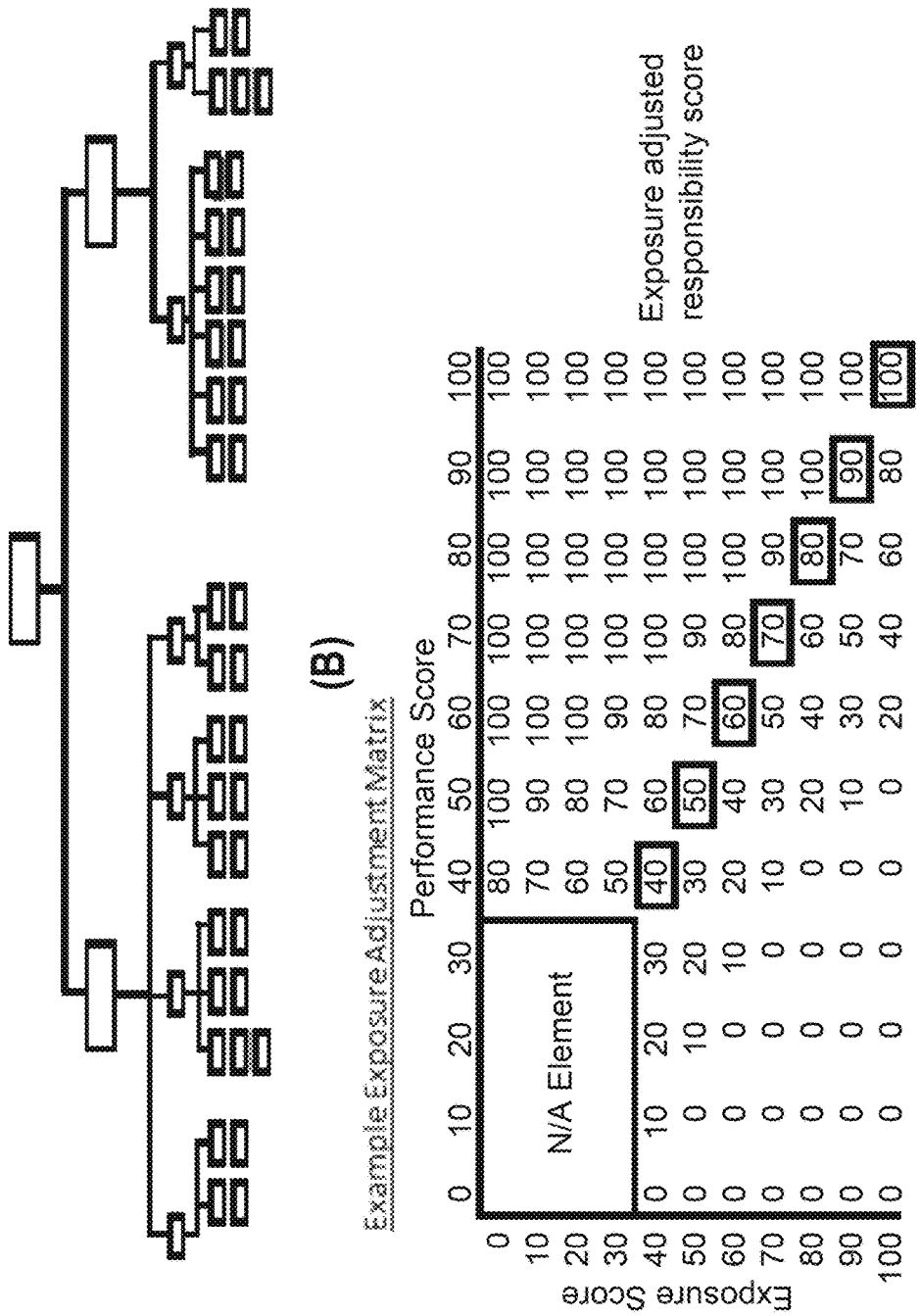
FIG. 14 is a two-part view showing an exposure specific scoring tree at view (a) and an example exposure adjustment matrix at view (b).

FIG. 14 is a two-part view showing an exposure specific scoring tree at view (a) and an example exposure adjustment matrix at view (b). In one embodiment, exposure adjustment is programmed using the average centered method represent in this code snippet:

```
def Exposure_Modifier(Score, Exposure):
    return min(max(65. + (Score * Exposure),0),100)
```

At the entry level, elements are adjusted for exposure according to the preceding process, which serves to adjust the weight of elements on a technical basis and not based on the relative importance of performance goals. Technical performance scores are created representing how well an operator addresses the technical challenges that they face. These scores are then "normalized" based on location based exposure in order to represent the responsibility of an operator. For example, in an area with no surrounding community, an operator will not be required to have a best in class community score to receive an overall best in class rating. In one embodiment, the exposure scoring algorithm is the same as described above. The exposure score is calculated based on more inputs and is taken from the top of the exposure tree, based on cumulative location-based exposure as compared to specific technical exposure.

4. Hardware Overview

Figure 15:
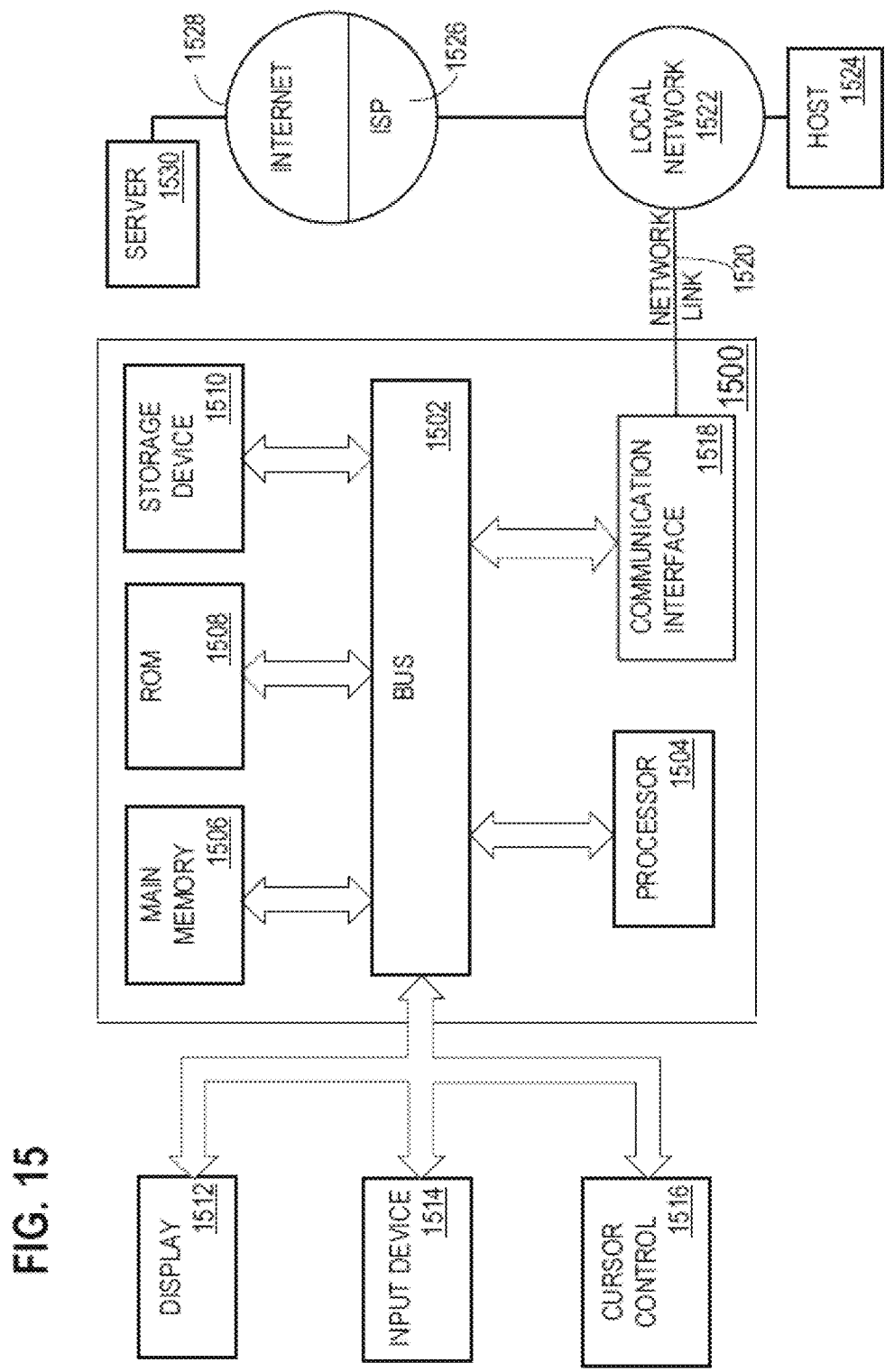
FIG. 15 is a block diagram that illustrates a computer system upon which an embodiment of the invention may be implemented.

FIG. 15 is a block diagram that illustrates a computer system 1500 upon which an embodiment of the invention may be implemented. Computer system 1500 includes a bus 1502 or other communication mechanism for communicating information, and a processor 1504 coupled with bus 1502 for processing information. Computer system 1500 also includes a main memory 1506, such as a random access memory (RAM) or other dynamic storage device, coupled to bus 1502 for storing information and instructions to be executed by processor 1504. Main memory 1506 also may be used for storing temporary variables or other intermediate information during execution of instructions to be executed by processor 1504. Computer system 1500 further includes a read only memory (ROM) 1508 or other static storage device coupled to bus 1502 for storing static information and instructions for processor 1504. A storage device 1510, such as a magnetic disk or optical disk, is provided and coupled to bus 1502 for storing information and instructions.

Computer system 1500 may be coupled via bus 1502 to a display 1512, such as a cathode ray tube (CRT), for displaying information to a computer user. An input device 1514, including alphanumeric and other keys, is coupled to bus 1502 for communicating information and command selections to processor 1504. Another type of user input device is cursor control 1516, such as a mouse, a trackball, or cursor direction keys for communicating direction information and command selections to processor 1504 and for controlling cursor movement on display 1512. This input device typically has two degrees of freedom in two axes, a first axis (e.g., x) and a second axis (e.g., y), that allows the device to specify positions in a plane.

The invention is related to the use of computer system 1500 for implementing the techniques described herein. According to one embodiment of the invention, those techniques are performed by computer system 1500 in response to processor 1504 executing one or more sequences of one or more instructions contained in main memory 1506. Such instructions may be read into main memory 1506 from another machine-readable medium, such as storage device 1510. Execution of the sequences of instructions contained in main memory 1506 causes processor 1504 to perform the process steps described herein. In alternative embodiments, hard-wired circuitry may be used in place of or in combination with software instructions to implement the invention. Thus, embodiments of the invention are not limited to any specific combination of hardware circuitry and software.

The term "machine-readable medium" as used herein refers to any medium that participates in providing data that causes a machine to operation in a specific fashion. In an embodiment implemented using computer system 1500, various machine-readable media are involved, for example, in providing instructions to processor 1504 for execution. Such a medium may take many forms, including but not limited to storage media and transmission media. Storage media includes both non-volatile media and volatile media. Non-volatile media includes, for example, optical or magnetic disks, such as storage device 1510. Volatile media includes dynamic memory, such as main memory 1506. Transmission media includes coaxial cables, copper wire and fiber optics, including the wires that comprise bus 1502. Transmission media can also take the form of acoustic or light waves, such as those generated during radio-wave and infra-red data communications. All such media must be tangible to enable the instructions carried by the media to be detected by a physical mechanism that reads the instructions into a machine.

Common forms of machine-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of machine-readable media may be involved in carrying one or more sequences of one or more instructions to processor 1504 for execution. For example, the instructions may initially be carried on a magnetic disk of a remote computer. The remote computer can load the instructions into its dynamic memory and send the instructions over a telephone line using a modem. A modem local to computer system 1500 can receive the data on the telephone line and use an infra-red transmitter to convert the data to an infra-red signal. An infra-red detector can receive the data carried in the infra-red signal and appropriate circuitry can place the data on bus 1502. Bus 1502 carries the data to main memory 1506, from which processor 1504 retrieves and executes the instructions. The instructions received by main memory 1506 may optionally be stored on storage device 1510 either before or after execution by processor 1504.

Computer system 1500 also includes a communication interface 1518 coupled to bus 1502. Communication interface 1518 provides a two-way data communication coupling to a network link 1520 that is connected to a local network 1522. For example, communication interface 1518 may be an integrated services digital network (ISDN) card or a modem to provide a data communication connection to a corresponding type of telephone line. As another example, communication interface 1518 may be a local area network (LAN) card to provide a data communication connection to a compatible LAN. Wireless links may also be implemented.

In any such implementation, communication interface 1518 sends and receives electrical, electromagnetic or optical signals that carry digital data streams representing various types of information.

Network link 1520 typically provides data communication through one or more networks to other data devices. For example, network link 1520 may provide a connection through local network 1522 to a host computer 1524 or to data equipment operated by an Internet Service Provider (ISP) 1526. ISP 1526 in turn provides data communication services through the world wide packet data communication network now commonly referred to as the "Internet" 1528. Local network 1522 and Internet 1528 both use electrical, electromagnetic or optical signals that carry digital data streams. The signals through the various networks and the signals on network link 1520 and through communication interface 1518, which carry the digital data to and from computer system 1500, are exemplary forms of carrier waves transporting the information.

Computer system 1500 can send messages and receive data, including program code, through the network(s), network link 1520 and communication interface 1518. In the Internet example, a server 1530 might transmit a requested code for an application program through Internet 1528, ISP 1526, local network 1522 and communication interface 1518.

The received code may be executed by processor 1504 as it is received, and or stored in storage device 1510, or other non-volatile storage for later execution. In this manner, computer system 1500 may obtain application code in the form of a carrier wave.

5. Example Figures

Figure 16:
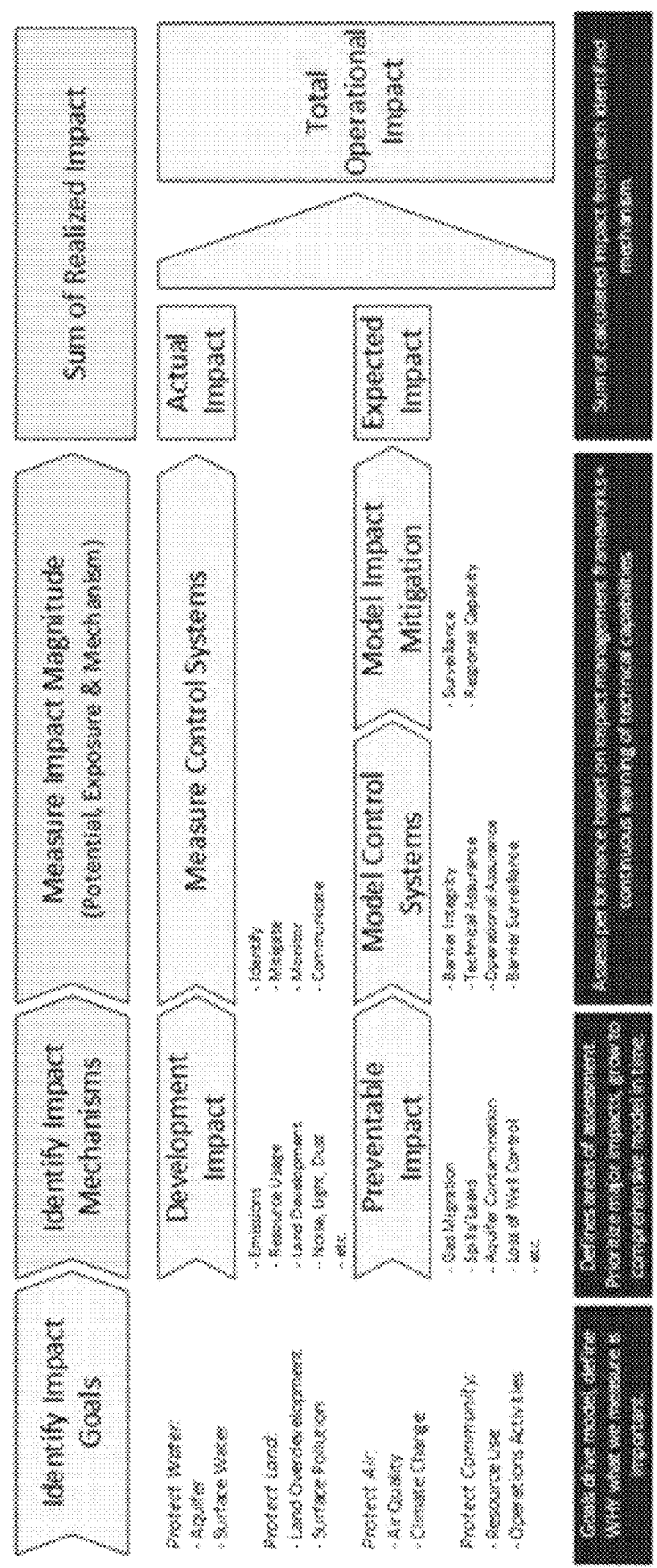
FIG. 16 illustrates an example process flow with specific examples applied to an exploration and production assessment.

FIG. 16 illustrates an example process flow with specific examples applied to an exploration and production assessment. Specifically, assessment methodology 1600 is shown, which steps through identifying impact goals (such as protecting land, from land overdevelopment or surface pollution), identifying impact mechanisms (such as development impact and preventable impact), measuring impact magnitude (such as measuring and modeling control systems, and modeling mitigation) and finally summarizing the realized impact to arrive at a total operational impact.

Figure 17:
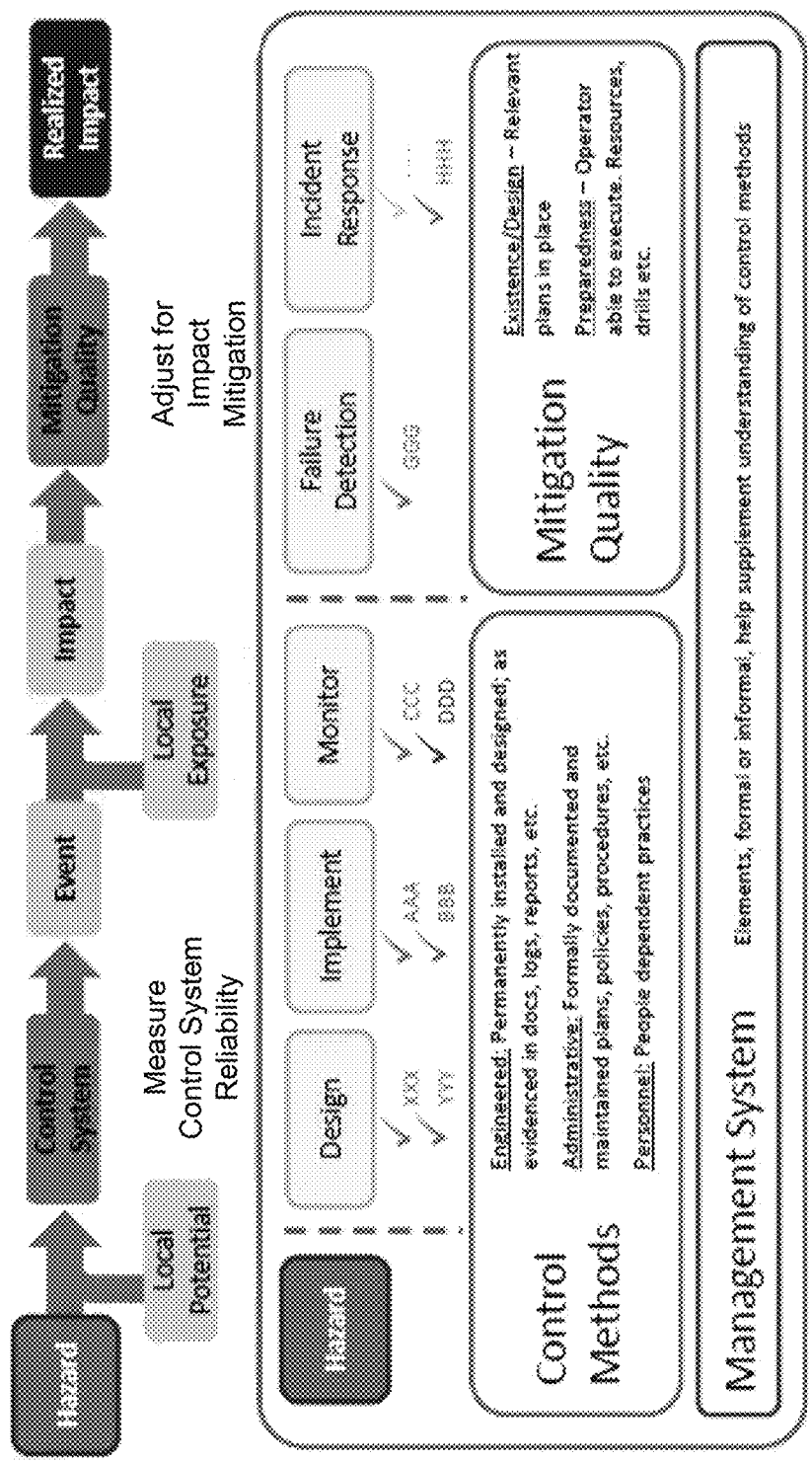
FIG. 17 illustrates an example of combining frameworks to model control effectiveness.

FIG. 17 illustrates an example of combining frameworks to model control effectiveness. Specifically, 1700 shows the detailed logic structure that applies industry frameworks (e.g. bow tie, hazard/control, management systems, etc.) in a novel, comprehensive fashion which allows analyzation efforts as part of a system where they are more meaningful than individual components and define standard logic per hazard. Components are assessed on reliability metrics such as Engineered, Administrative, and Personnel while a management systems bucket is in the background of all the processes and procedures.

Figure 18:
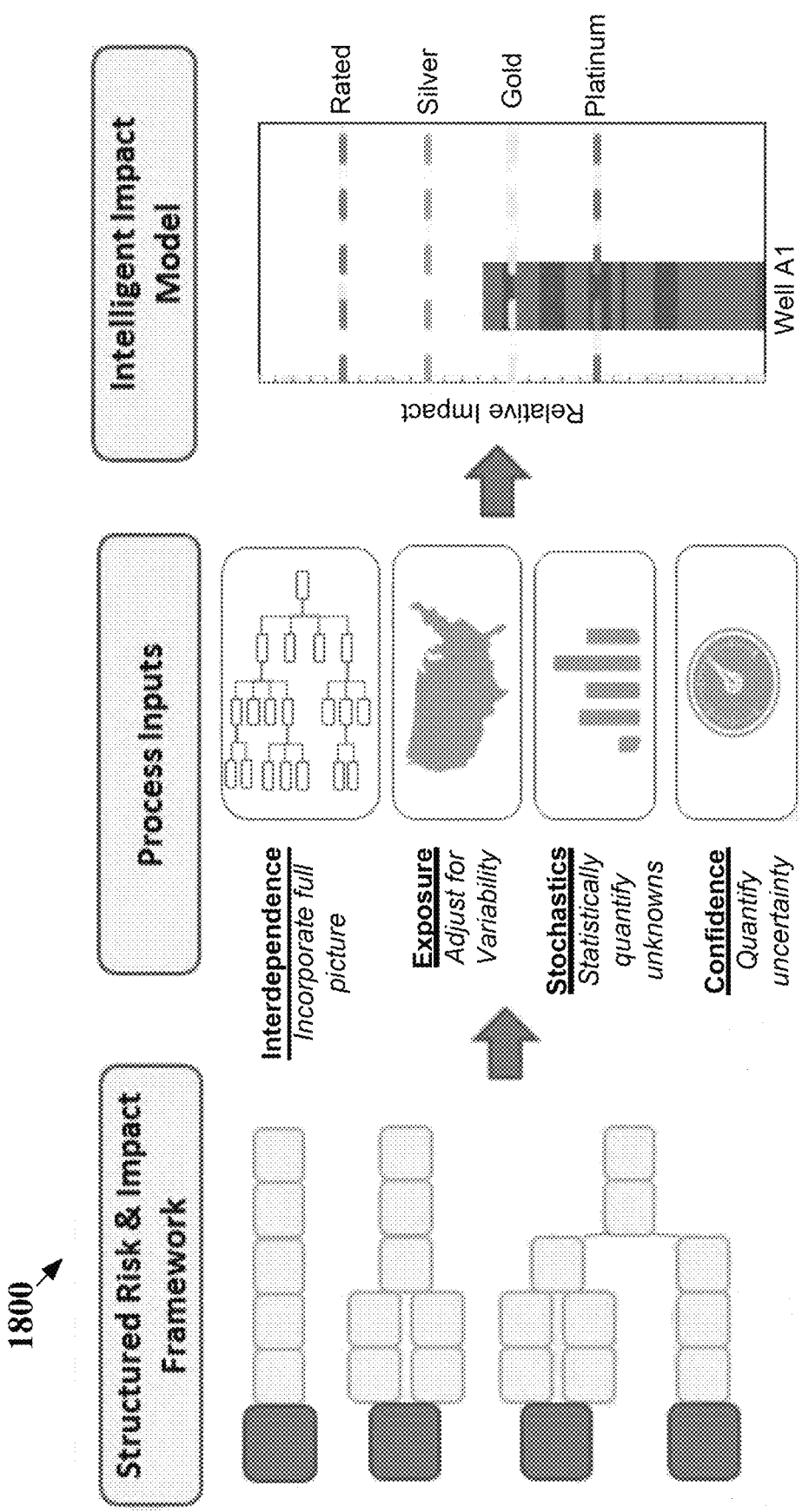
FIG. 18 illustrates an example of processing the framework of FIG. 17.

FIG. 18 illustrates an example of processing the framework of FIG. 17. Specifically, 1800 shows a high level schematic of how the framework from FIG. 17 is processed via the concepts of interdependence, exposure, stochastics, and confidence. The end result is a per-component assessment of relative impact based on an "impact index."

Figure 19:
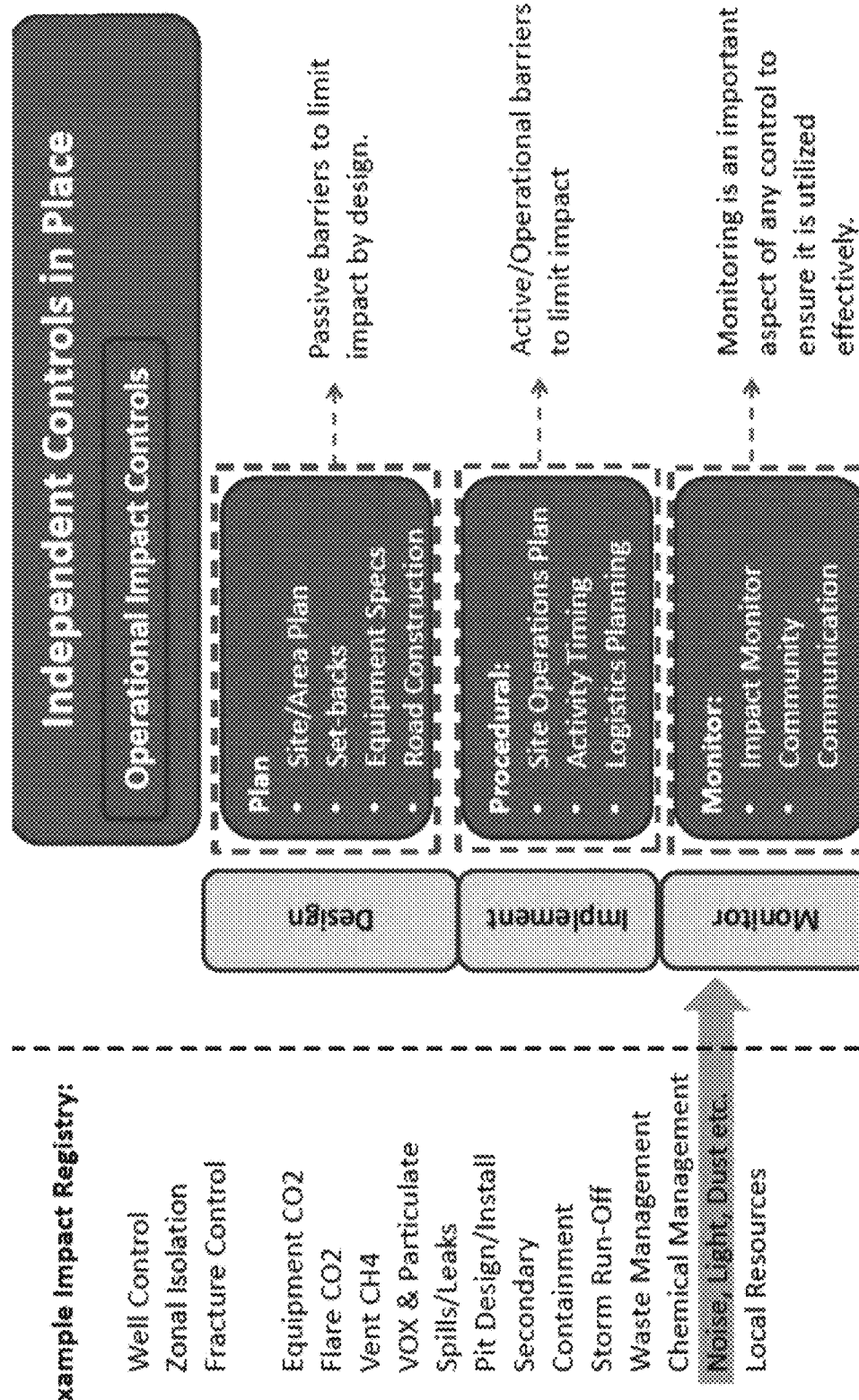
FIG. 19 illustrates an example application of the framework of FIG. 17.

FIG. 19 illustrates an example application of the framework of FIG. 17. Specifically, 1900 shows an example related to noise, light, and dust, where design, implementation, and monitoring are taken into consideration.

Figure 20:
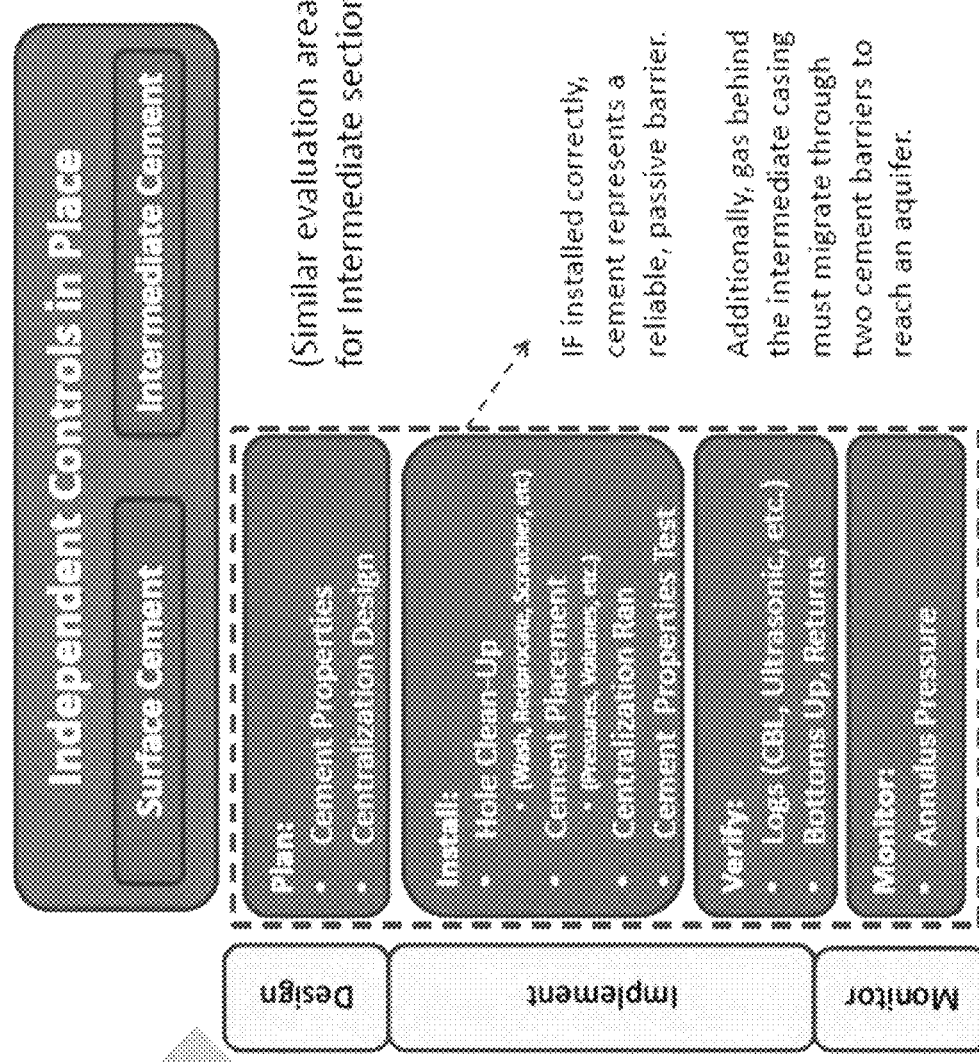
FIG. 20 illustrates a second example application of the framework of FIG. 17.

FIG. 20 illustrates a second example application of the framework of FIG. 17. Specifically, 2000 shows an example related to zonal isolation where design, implementation, and monitoring are taken into consideration.

Figure 21:
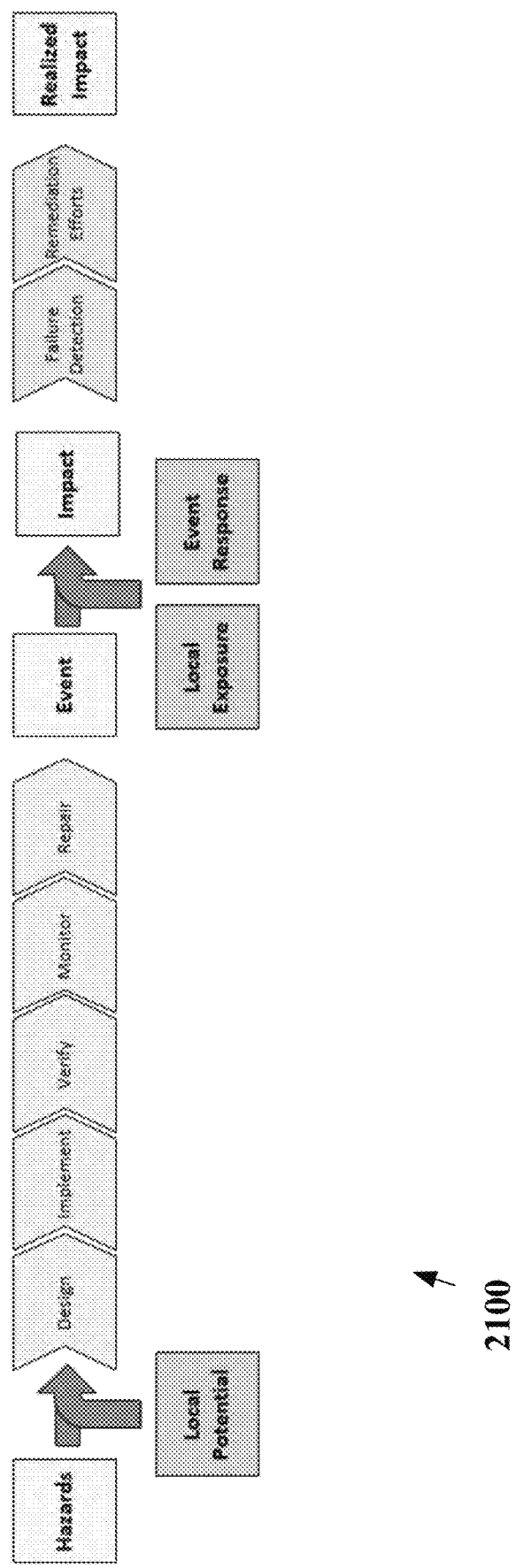
FIG. 21 illustrates a more detailed example of the components of FIG. 17.

FIG. 21 illustrates a more detailed example of the components of FIG. 17. Specifically, 2100 shows specific things considered for each aspect of the components of FIG. 17.

Figure 22:
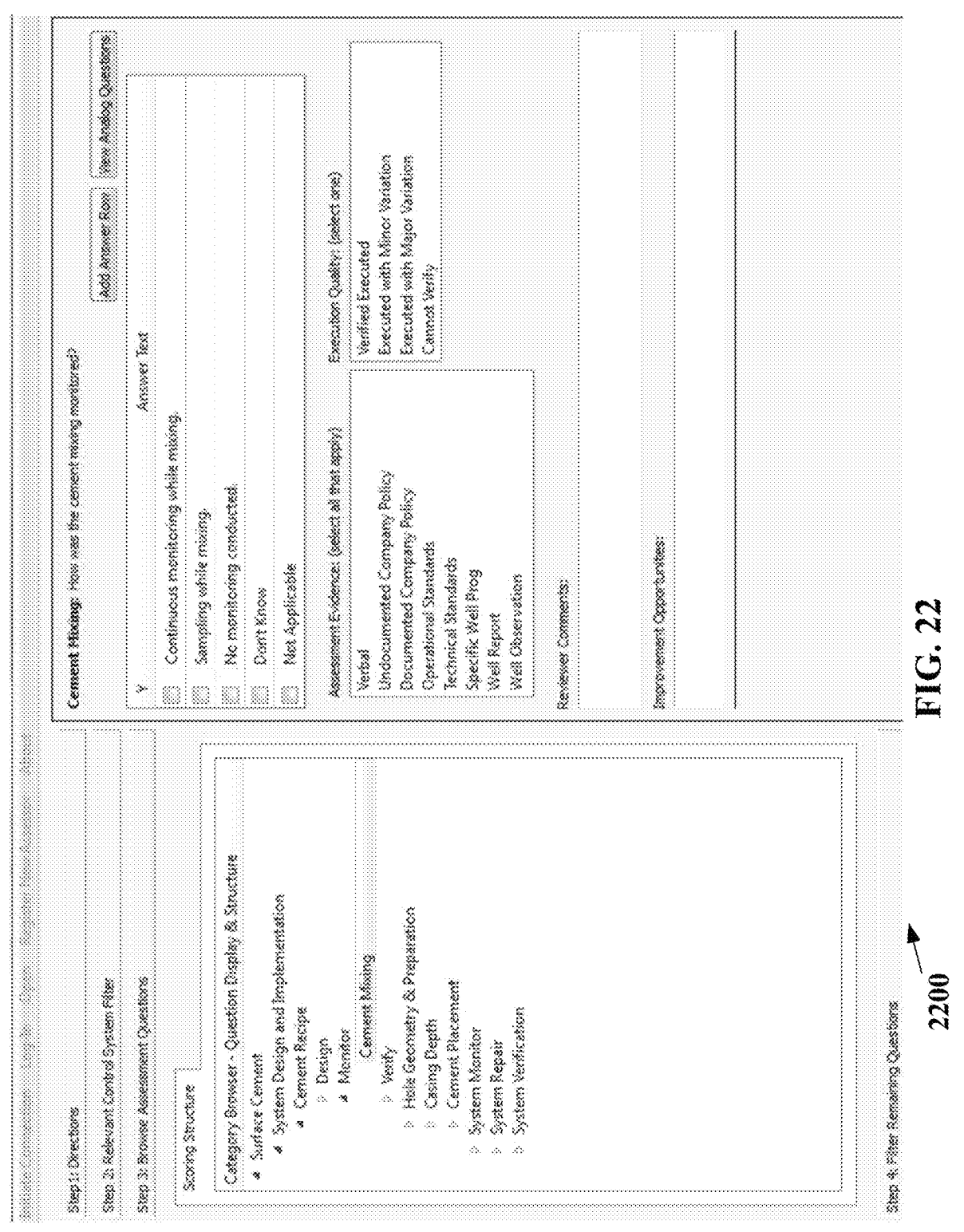

FIG. 22 illustrates an example screen display of a computer display device showing an assessment interface. Specifically, 2200 shows an assessment interface and scoring structure that presents questions in a logical, efficient manner allowing for the capture of information important to the process described herein.

Figure 23:
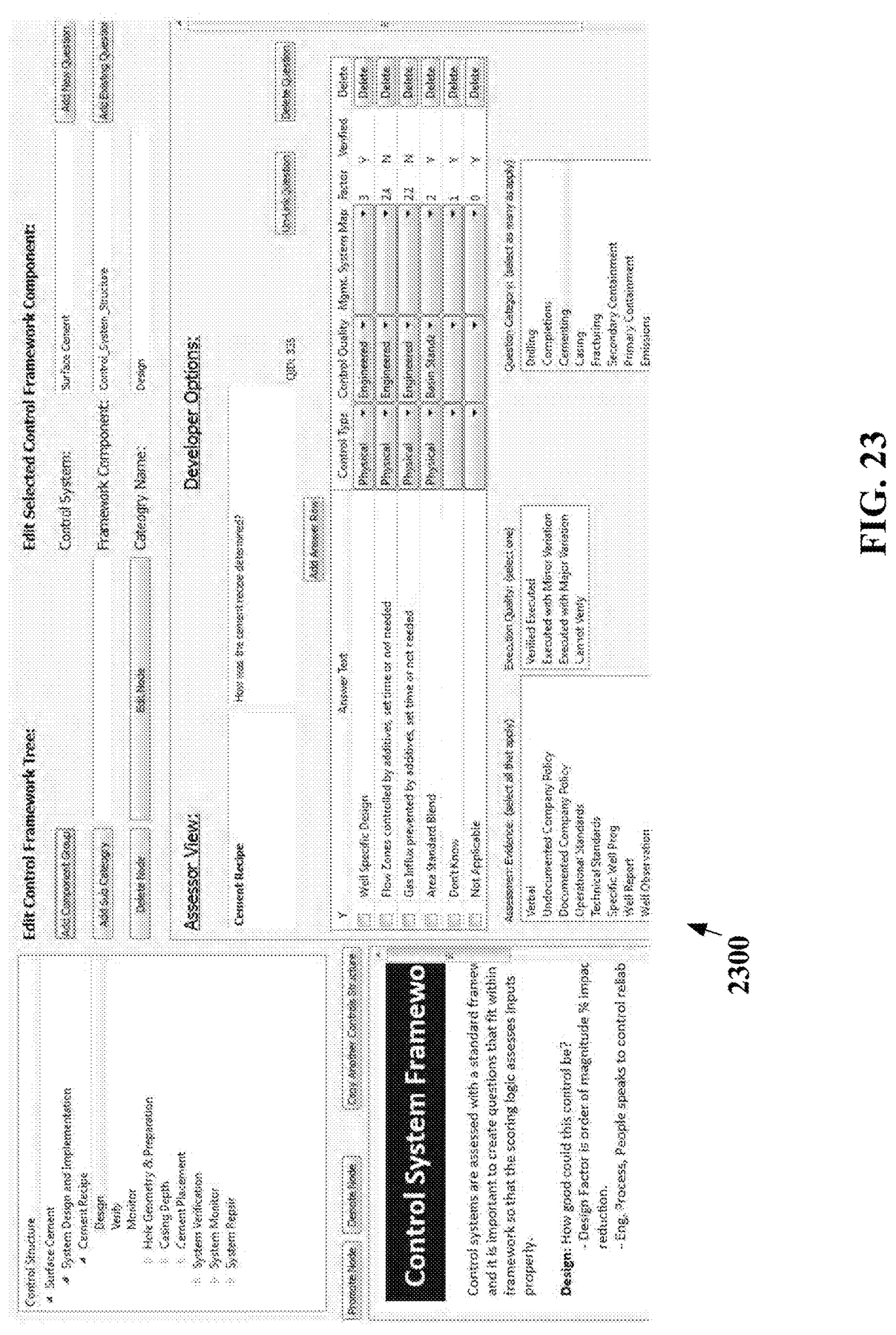

FIG. 23 illustrates an example screen display of a computer display device showing a content development interface. Specifically, 2300 shows a content development interface which allows answers to be coded according to the qualities discussed above. Doing this work in the background via a standard process ensures the objectivity of the assessment.

6. Example System Implementation

FIG. 2 illustrates an example computer system in which the techniques described may be practiced, according to one embodiment. In an embodiment, the system comprises components that are implemented at least partially by hardware at one or more computing devices, such as one or more hardware processors executing stored program instructions stored in one or more memories for performing the functions that are described herein. In other words, all functions described herein are intended to indicate operations that are performed using programming in a special-purpose computer or general-purpose computer, in various embodiments. FIG. 2 illustrates only one of many possible arrangements of components configured to execute the programming described herein. Other arrangements may include fewer or different components, and the division of work between the components may vary depending on the arrangement.

In one embodiment, score generating computer 208 may include additional program instructions beyond those discussed above, either in the form of additional components or applications, or in additional program instructions included in score generating instructions 218, transformation instructions 222, score assignment instructions 24, and uncertainty and exposure normalization instructions 226. Any of the embodiments discussed below may be performed by any suitable component of FIG. 2, such as score generating computer 208.

In one embodiment, score generating computer 208 comprises program instructions that are programmed or configured to generate an impact index and master event profiles. An impact index is a normalized index that represents the relative impact of various types of events on the same scale. The events in impact index are also weighted for the frequency of the events. Thus, a small scale but extremely common event may receive a similar rating as a large scale but extremely rare event, due to the weighting. An impact index may be continuously updated as the system receives additional information, and any results computed using an impact index may periodically be regenerated, to ensure that the results use the most up to date and accurate impact index. Storage unit 220 stores an impact index in any suitable manner, such as using a database.

In one embodiment, score generating computer 208 comprises program instructions that are programmed or configured to identify and/or determine all events that may occur during an oil or gas processing operation. The events include such minor disturbances as light or noise pollution, oil spills, gas spills, leaks, odor releases, disturbances caused by dust or dirt, and such major events as a well blowout or other catastrophic problems, and anything between. Score generating computer 208 generates an impact index using any available data including, but not limited to: actual or historical event data (such as spill reports), data from studies or research, analogs or other data sources, and expert input. Once collected, score generating computer 208 uses the data to generate the impact index. The impact index may be generated in any suitable manner based on the available information. In one embodiment, score generating computer 208 uses a predefined mapping to define the relative weightings of different events. For example, a spill of a barrel of oil may be assigned one point, while road damage from heavy equipment may be assigned two points. In other words, an impact index allows for comparisons to be made between different types of events.

In one embodiment, score generating computer 208 comprises program instructions that are programmed or configured to generate a master event profile. A master event profile is an application of an impact index for a particular event, and is a ranking of relative magnitude for the event. Specifically, a master event profile is based on the average magnitude of the event when it occurs, weighted by the frequency with which the event occurs. The master event profile considers the various factors that are specific to the event to which the profile relates. For example, for an oil well, reservoir pressure has a significant impact on the potential magnitude of an event, and the master event profile represents the impact at different reservoir pressures. Any factors may be considered in a master event profile, and should not be limited to the above example. Score generating computer 208 generates master event profiles using any available data in any suitable manner. Storage unit 220 stores multiple master event profiles in any suitable manner, such as using a database.

Figure 24:
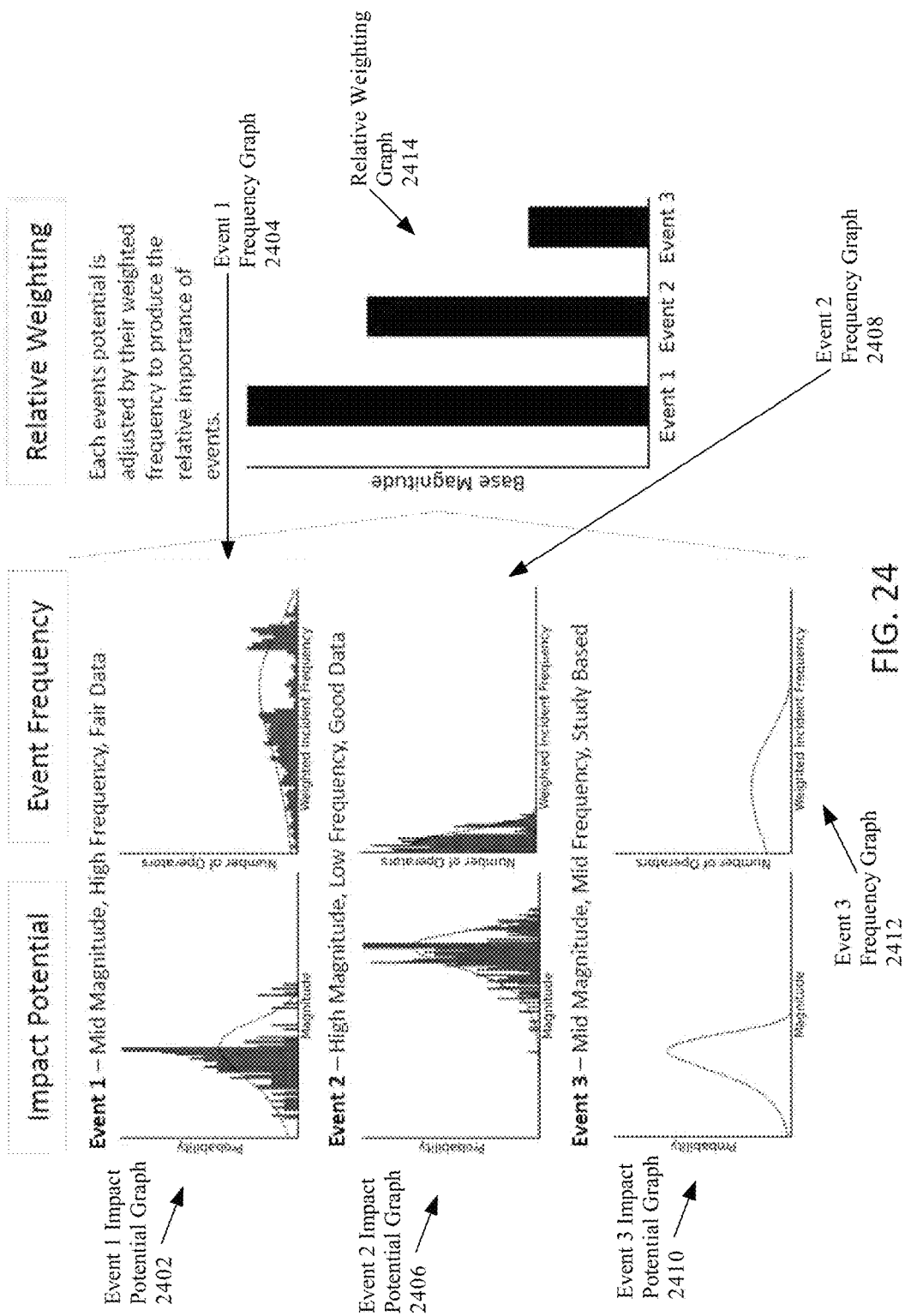
FIG. 24 illustrates an example of relative weighting of event profiles.

An example of the impact potential, event frequency, and relative weighting concepts used in the master event profile and impact index is shown in FIG. 24. FIG. 24 illustrates an example of relative weighting of event profiles. Specifically, FIG. 24 includes event 1 impact potential graph 2402, event 1 frequency graph 2404, event 2 impact potential graph 2406, event 2 frequency graph 2408, event 3 impact potential graph 2410, event 3 frequency graph 2412, and relative weighting graph 2414. The three impact potential graphs (2402, 2406, and 2410) display a distribution of the probability of an event occurring at a given magnitude, with no consideration given to the frequency of occurrences—that is addressed in the frequency graphs. Thus, event 1 impact potential graph 2402 shows that event 1 has a high probability of occurring at a medium magnitude, and much less probability of occurring at a lower or higher magnitude. Event 2 impact potential graph 2406 shows that event 2 has a high probability of occurring at high magnitudes, and almost no chance of occurring at a low magnitude. Meanwhile, event 3 impact potential graph 2410 shows that event 3 has a high probability of occurring at a medium magnitude, and no chance of occurring at a high magnitude.

The three frequency graphs (2404, 2408, and 2412) display a distribution of the number of operators against the weighted incident frequency. Event 1 frequency graph 2404 shows that event 1 occurs at a high frequency. In contrast, event 2 frequency graph 2408 shows that event 2 occurs at a very low frequency. Event 3 frequency graph 2412 shows that event 3 occurs at a medium frequency. Values in the distributions that are digitally stored and used to generate the graphs may be adjusted by their weighted frequency, using a programmed algorithm to yield a plurality of relative importance value representing the relative importance of events. The programmed algorithm weights events by the cumulative potential for impact using, for example, Frequency=Occurrences Per Well (occurrences per well may be less than 1) and Frequency adjust impact index=Magnitude*Frequency. For example, relative weighting graph 2414 represents digitally stored relative importance values, in the form of base magnitude values, for the three events. As FIG. 24 shows, the frequency and magnitude of events results in different relative weights—"event 1" receives the largest relative weight due to the medium magnitude and high frequency, while "event 3" receives the smallest relative weight due to the medium magnitude and frequency.

Returning to FIG. 2, in one embodiment, score generating computer 208 comprises program instructions that are programmed or configured to identify and/or generate local condition data. Local condition data is aggregated data related to local conditions that modify the potential impact, likelihood, frequency, or other attributes of an event. For example, local condition data may include, but is not limited to: land, water, community, and air factors such as population density, land value, infrastructure proximity, political climate, water flow lines, rock type, aquifer depth, biological diversity, weather patterns or history, etc. Local condition data may be formatted in any manner and at any level of detail. For example, local condition data may represent the local conditions as low, medium, or high risk, based on the various inputs. Local condition data may be used in conjunction with master event profiles, an impact index, and/or control effort data to determine an objective score for an oil or gas processing operation. Score generating computer 208 comprises program instructions that are programmed or configured to process the collected data to generate local condition data using any method and any available data from sources including, but not limited to: studies, reports, governmental agencies, census data, expert input, etc. Storage unit 220 stores local data in any suitable manner, such as using a database.

In one embodiment, score generating computer 208 comprises program instructions that are programmed or configured to generate control effort data. Control effort data describes efforts to control events, such as each event identified in the impact index or master event profiles, and the expected effect of the control efforts, in either a relative measure or an effective difference. Specifically, the control efforts are precautions or other preventative measures intended to reduce the occurrence of one or more events. Control effort data identifies each of the possible control efforts for each event. For each possible control effort, the basic components are identified, such as design, install, monitoring, procedural issues, verification, and/or repairs. For each basic component, the quality may be assessed, such as whether the design was based on engineering or guess work. Control effort data may also include data relating to how effective component of each control effort is on reducing the occurrence of associated events. Control effort data may include a control assessment framework which, as discussed above, may be a tree or other structure that organizes all the components and considerations of the control efforts for events. The control assessment framework may be displayed, to one or more users who provide information relating to the control efforts performed at a given oil or gas processing operation. Initial levels of the control assessment framework may require no expert knowledge. The deeper, more specific information within the control assessment framework may require some expert knowledge and/or documentation to provide verification, among other uses. Storage unit 220 stores control effort data in any suitable manner, such as using a database.

Figure 25:
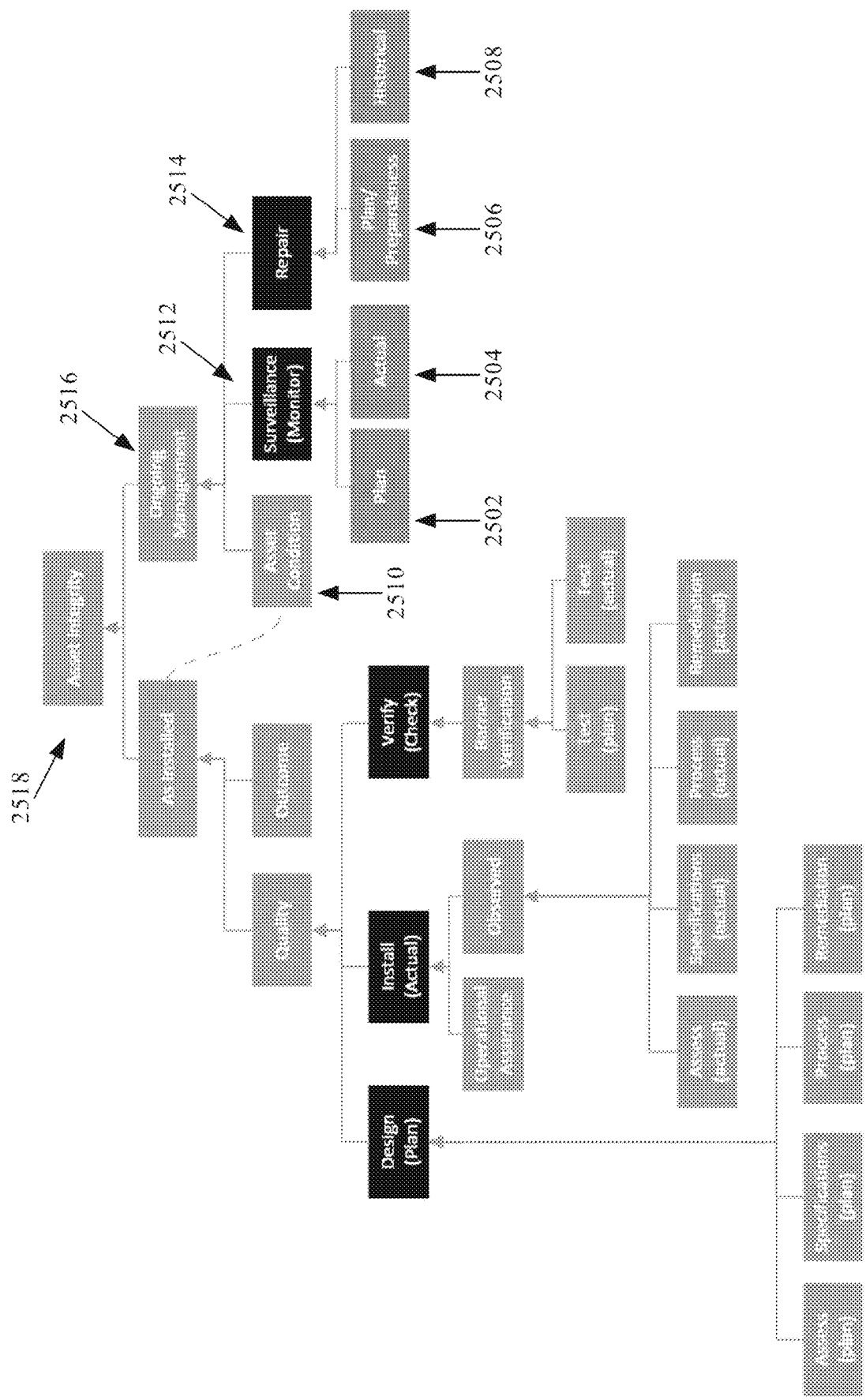
FIG. 25 illustrates an example of a control effort data framework.

FIG. 25 illustrates an example of a control effort data framework. Specifically, FIG. 25 shows an example control effort data framework associated with asset integrity 2518. The data in FIG. 25 is stored as digital data organized in nodes of a multiway tree. Each node represents different factors or elements that are considered when determining the overall score for asset integrity 2518. One element considered is asset condition 2510. Information relating to the asset condition 2510 may be submitted using text, pictures, or other documentation. Better documentation may result in a better score. In other words, a user submitting that the asset condition 2510 is "good" may be given less weight than a series of pictures showing the actual condition of the asset or a report from a third party inspector. Another element considered is the surveillance and monitoring 2512. Surveillance and monitoring 2512 includes two child nodes, plan 2502 and actual 2504. Plan 2502 is for the planned surveillance of the asset, while actual 2504 is for the type of monitoring that is actually performed. By considering whether a plan was present or not (and/or the quality of said plan) in addition to the actual results (i.e., whether the monitoring was better/worse/the same as planned), a more accurate representation of the surveillance and monitoring 2512 can be determined. Another element considered is repair 2514. Repair 2514 also has two child nodes, plan 2506 and historical 2508. Plan 2506 considers advance planning for repairs and maintenance, while historical 2508 considers what has been done in the past. A combination of asset condition 2510, surveillance and monitoring 2512, and repair 2514 results in a score for the overall ongoing management 2516 of the asset. Likewise, the score for ongoing management 2516 is combined with the score for the left half of the tree to arrive at a final score for asset integrity 2518.

As FIG. 25 shows, many different elements of asset integrity are considered, and the presence (or absence) of data for each element, as well as the quality of implementation of that element, are considered and flow up the tree to arrive at a score or rating for asset integrity, as discussed above. The example shown in FIG. 25 considers only asset integrity, and is but one of many different control efforts that the system described herein may consider.

Returning to FIG. 2, in one embodiment, score generating computer 208 comprises program instructions that are programmed or configured to receive control data relating to a particular oil or gas processing operation and generate a relative control quality difference. The data for a particular oil or gas processing operation may be received through an application, interface, and/or any other method. A relative difference may be scored on a scale of 0 to 10, and is based off of how the controls in place for a particular oil or gas processing operation relate to the controls in place for other oil or gas processing operations. Thus, the oil or gas processing operations who are doing the most or best based on the structures described in control effort data, would receive a 10, while the oil or gas processing operation doing the least would receive a 0. For the relative control quality difference, score generating computer 208 does not consider the actual effectiveness of the individual control efforts taken.

In one embodiment, score generating computer 208 comprises program instructions that are programmed or configured to generate an effective control quality. An effective control quality measures how effective the control efforts taken are. Score generating computer 208 processes control effort data to determine the impact of incremental changes in control quality to event occurrence and magnitude. However, this requires large amount of data that may not always be available. When the needed amount of data is not available, score generating computer 208 generates example cases (such as best performer, regulatory minimum, high performing, etc.), and uses the example cases to predict how effective different control efforts are. For example, a high concentration of low qualities in required practices shows that higher quality does not make a significant difference. In contrast, a high concentration of high quality in required practices shows that slight drops in relative quality result in significant effective quality losses. Thus, over time, score generating computer 208 is able to determine the effectiveness of individual elements of control efforts.

In one embodiment, score generating computer 208 comprises program instructions that are programmed or configured to verify control data. Verification may involve processing supporting documentation such as blueprints or design documents, processing results from the oil or gas processing operation such as a well log, receiving input from one or more employees or third parties during a visit to the oil or gas processing operation, processing of documentation filed with the government or other agencies, etc. In some embodiments, the quality of the verification is less important than mere presence of the verification. For example, the quality of a provided design document may not be known, but by merely possessing and supplying a design document a determination may be made that the operator of an oil or gas processing operation is planning out their actions in advance, rather than flying by the seat of their pants, and planning nearly always results in better and safer outcomes.

In one embodiment, score generating computer 208 comprises program instructions that are programmed or configured to generate an objective score. The objective score is generated using the impact index, master event profiles, local condition data specific to a particular oil or gas processing operation, and control effort data specific to a particular oil or gas processing operation. The local condition data and control effort data specific to a particular oil or gas processing operation may be received in any manner, over any period of time, and from any number of sources. The data may be received as discussed above, such as from mobile computing device 203, process and equipment observation data 204, from expert or layperson input via an interface, or any other suitable component of FIG. 2. Specifically, the objective score is a normalized index of expected impact of all potential events and risks that are associated with a particular oil or gas processing operation that is benchmarked against other oil and gas processing operations. Thus, the objective score may be used to easily compare oil and gas processing operations from different regions and/or operators.

7. Example Functional Implementation

Figure 26A:
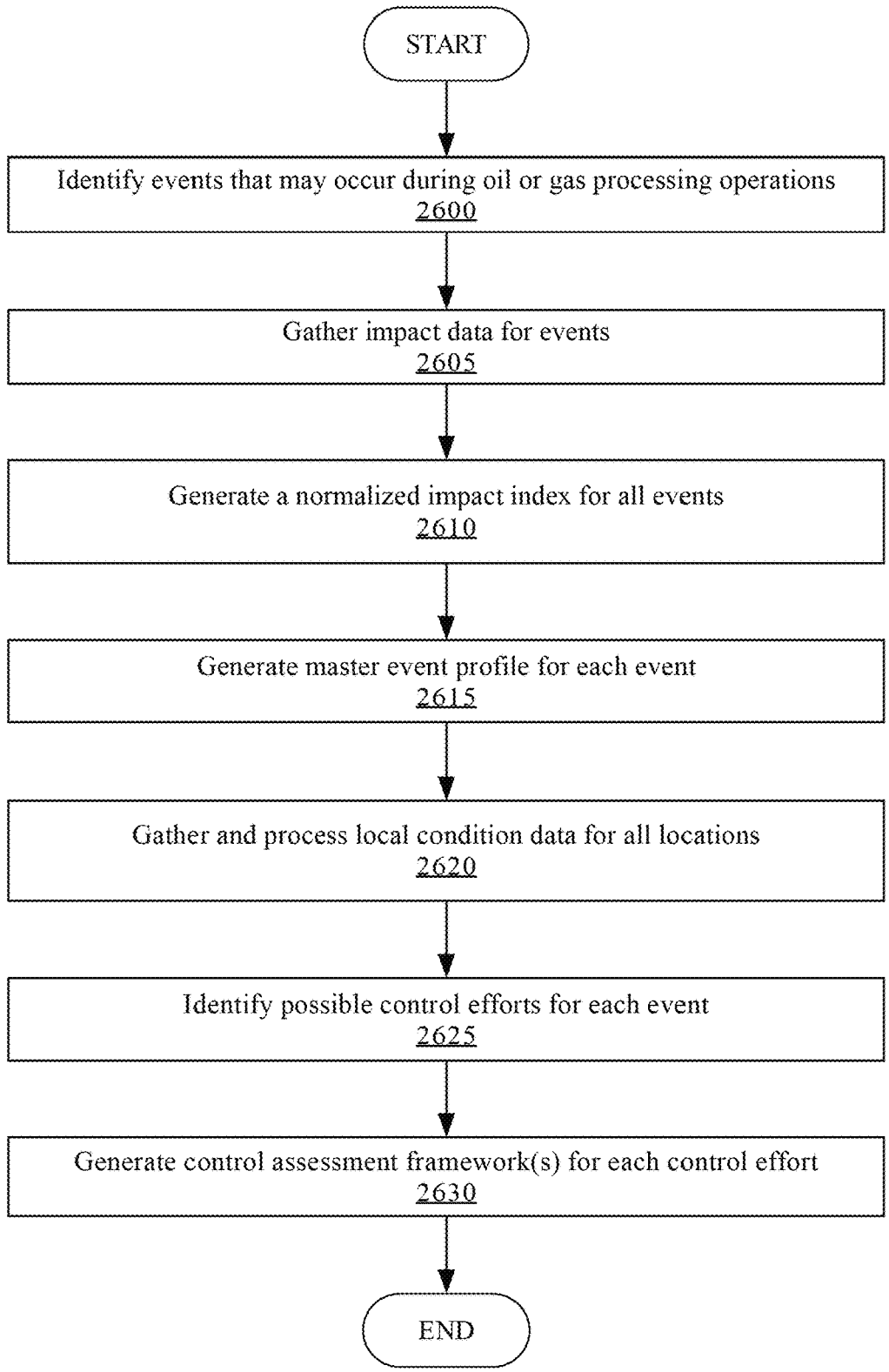
FIG. 26A and FIG. 26B illustrate an example algorithm that may be implemented using one or more computer programs to implement an embodiment.
Figure 26B:
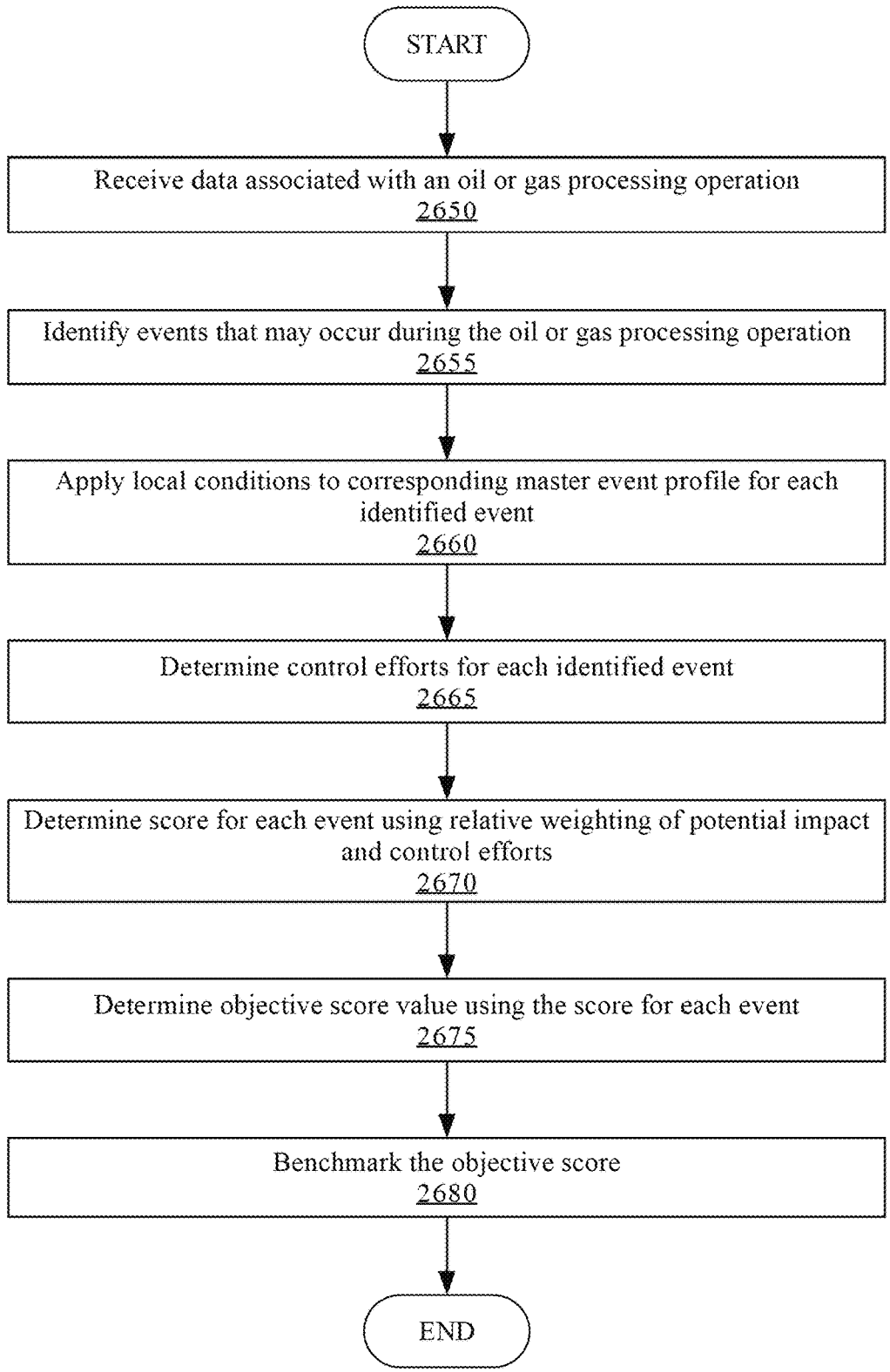

FIG. 26A and FIG. 26B illustrate an example programmable algorithm or method for generating an objective score value specifying an estimated impact of an oil or gas processing operation. Although the steps in FIG. 26A and FIG. 26B are shown in an order, the steps of FIG. 26A and FIG. 26B may be performed in any order, and are not limited to the order shown in FIG. 26A and FIG. 26B. Additionally, some steps may be optional, may be performed multiple times, and/or may be performed by different components. All steps, operations and functions of a flow diagram that are described herein are intended to indicate operations that are performed using programming in a special-purpose computer or general-purpose computer, in various embodiments. In other words, each flow diagram in this disclosure is a guide, plan or specification of an algorithm for programming a computer to execute the functions that are described, at the same level of detail that is custom among persons of skill in the art to which the disclosure pertains, to communicate among themselves about the structure, function, or algorithms to be used to implement operational programs of this type.

Beginning with FIG. 26A, in step 2600, events that may occur during oil or gas processing operations are identified. The events include all accidents, disturbances, and other negative events. The identified events may not apply to all oil or gas processing operations. For example, an oil well in Alaska may encounter events related to snow or ice, while an oil well in the Arizona desert could not possibly encounter an event related to snow or ice.

In step 2605, impact data for events is gathered. The impact data is gathered and/or received from all available sources including, but not limited to: actual or historical data (such as spill reports), data from studies or research, analogs or other data sources, and expert input. The data may be gathered and/or received in any format and can relate to frequency of events and how large the magnitude of an event can be.

In step 2610, a normalized impact index is generated for all events. Generating the impact index may involve determining a score or other value for each event that represents the impact of each event relative to the other events. This score value may be based in part on a mapping, or other suitable method. The impact index is represented as one or more distributions.

In step 2615, a master event profile is generated for each event. The master event profile represents the impact index for a particular event, and more fully takes into account the variables related to an event, such as well pressure, rock formations, type of resource, etc. The master event profile is also represented as one or more distributions.

In step 2620, local conditional data is gathered and processed. The local condition data includes information such as population density, environmental sensitivity, political climate, and may be gathered from studies, governmental reports, maps, etc. The local condition data is processed in any manner, and results in a map or other format that represents the overall local conditions. The local conditions may be compiled into a low, medium, or high risk, broken down by air, water, community, and/or land, and/or more specificity may be provided.

In step 2625, possible control efforts are identified for each event. The possible control efforts are steps that operators of oil or gas processing operations may take to control the possible risks of negative events happening. These control efforts may include design information, engineering decisions, equipment used, quality of work, maintenance schedules, and/or any other available information.

In step 2630, a control assessment framework is generated for each control effort. The control assessment framework is a tree or other data structure, such as those discussed above, that allows for easy input of information relating to control efforts, shows how the different components of control efforts relate, and is used in generating a score for the effectiveness of the associated control effort.

Turning to FIG. 26B, in step 2650, data associated with an oil or gas processing operation is received. This data is specific to the oil or gas processing operation, such as the latitude and longitude (or other form of location data) of the oil or gas processing operation, and other specific information.

In step 2655, events that may occur during the oil or gas processing operation are identified. Using the data received in step 2650, the events that apply to the current oil or gas processing operation are identified in any manner.

In step 2660, local conditions are applied to the corresponding master event profile for each identified event. Using the information received in step 2650 and the local conditions generated in step 2620, the local conditions specific to the current oil or gas processing operation are determined, and are applied to the master event profiles for each event identified in step 2655. This generates a relative weighting of the potential impact of each event that is specific to the current oil or gas processing operation.

In step 2665, control efforts for each identified event are determined. The control efforts may be determined via information received from manual visits to the site by employees of the oil or gas processing operation or by third parties, by design documents, satellite pictures, forms or regulations submitted to or required by the government or other organizations, or any other source.

In step 2670, a score for each event is determined using relative weighting of potential impact and control efforts. Depending on the quality of the control efforts for a given event, the control efforts may increase or decrease the score—poor control efforts will result in a lower score, while going above and beyond the standards in the industry is needed to receive the best score.

In step 2675, an objective score value is determined using the score for each event. The objective score may be any combination of the scores generated from step 2670, such as an average or other method.

In step 2680, the objective score is benchmarked. The objective score is benchmarked against other oil and gas processing operations across a region, such as North America, or the world. Thus, the benchmarking compares the objective score of a particular oil or gas processing operation to the scores of other oil or gas processing operations, and results in a value that reflects the efforts taken at an oil or gas processing operation to ensure safe operation in view of all information related to the oil or gas processing operation.

8. Implementation Example

FIG. 27 illustrates an example objective score in accordance with an embodiment. FIG. 27 depicts a table 2700 comprising a plurality of rows 2702 and columns 2704. Rows 2702 represent stored digital data for different operational risks and columns 2704 store values of impact data associated with each risk. For example, a first row 2706 identifies the operational risk of "Equipment Leaks", and column values in columns 2704 specify an event profile value of 78, control effects value of 78%, water value of 141, land value of 127, null community value, for a normalized score of 134. Various other operational risks may be stored in the table 2700, such as waste impacts, well collision, well control—drilling, and transportation leaks. Each of these risks has an associated event profile which provides a normalized score. Similarly, each risk has control efforts associated with the risk. The control efforts are represented as a percentage of a maximum possible control efforts taken. A score below 100% may represent extremely safe control efforts. Next, FIG. 27 shows the scores generated for different local conditions using the event profile, control effects, and local data. The scores include a score for water, land, and community, as well as a total. The totals are used to generate the objective score 2708, which is benchmarked across the region, using a programmed algorithm. Approaches include arithmetic mean, weighted averages, linear regressions, a non-linear regression (such as the quasi-Kriging technique), etc. In an embodiment, the objective score 2708 may consider more elements than shown in FIG. 27.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A data processing method for execution using a programmed computer to generate a digitally stored objective score value specifying an estimated impact of an oil or gas processing operation on safety, health, production efficiency or economics, the method comprising:

receiving a plurality of digital data associated with the oil or gas processing operation;

identifying, using the plurality of data, a plurality of events that may occur during the oil or gas processing operation and storing digital data representing the plurality of events;

for each event of the plurality of events, generating an event-specific impact score, wherein the event-specific impact score represents the impact for each event relative to the impact of other events;

generating, using the event-specific impact score for each event, a normalized impact index for the plurality of events, wherein the normalized impact index comprises one or more distributions of impact magnitudes for the plurality of events;

for each event of the plurality of events, generating a digitally stored master event profile, wherein the master event profile is generated using the normalized impact index and one or more variables associated with each event, and wherein the digitally stored master event profile comprises one or more distributions of impact magnitudes for each event;

for each event of the plurality of events, using a first programmed algorithm, determining a relative weighting of potential impact of the event on safety, health, production efficiency or economics for the oil or gas processing operation using digitally stored data representing local conditions and the digitally stored master event profile for the event;

for each event of the plurality of events, generating one or more control assessment frameworks, wherein each control assessment framework is associated with a control effort that have been defined for the oil or gas processing operation, and wherein each control assessment framework is a tree data structure comprising of one or more nodes, and wherein each node represents a component of the control effort;

for each event of the plurality of events, using the one or more control assessment frameworks, determining and digitally storing an effectiveness value representing an effectiveness of one or more control efforts that have been defined for the oil or gas processing operation;

for each event of the plurality of events, using a second programmed algorithm, determining and digitally storing a score value using the relative weighting of the potential impact of the event and the effectiveness value of the one or more control efforts;

determining the objective digitally stored score value for the oil or gas processing operation using the score value for each event of the plurality of events and benchmarking the objective digitally stored score value to a plurality of objective digitally stored score values for other oil or gas processing operations;

wherein the steps are performed using one or more processors.

2. The method of claim 1, wherein the oil or gas processing operation is an oil processing operation, an oil well, a natural gas processing operation, a natural gas well, or a salt water disposal well.

3. The method of claim 1, wherein local conditions comprise one or more of: population density, community engagement, sensitivity of environment, animal density, and land value.

4. The method of claim 1, wherein the plurality of data comprises one or more of: a latitude value, a longitude value, an address value, a temperature value, a pressure value representing a pressure of a well, a well depth value, and digital values representing the one or more control efforts.

5. The method of claim 1, wherein the one or more variables associated with each event is based on one or more of: historical data, research data, analogous data, and expert data.

6. The method of claim 5, wherein the master event profile is associated with a geographical region.

7. The method of claim 1, wherein the effectiveness of the one or more control efforts is relative.

8. The method of claim 1, further comprising determining an absolute effectiveness for each of the one or more control efforts for a particular event using a plurality of occurrences of the particular event and any control efforts in place.

9. The method of claim 1, wherein the plurality of other oil or gas processing operations comprise oil or gas processing operations of different companies and oil or gas processing operations in different locations.

10. The method of claim 1, further comprising providing one or more suggestions for improving the objective digitally stored score value.

11. A computer system comprising:

a computing device comprising one or more processors;

an electronic digital data storage device coupled to the one or more processors and storing one or more sequences of instructions which, when executed by the one or more processors, cause the processor to perform:

receiving a plurality of digital data associated with the oil or gas processing operation;

identifying, using the plurality of data, a plurality of events that may occur during the oil or gas processing operation and storing digital data representing the plurality of events;

for each event of the plurality of events, generating an event-specific impact score, wherein the event-specific impact score represents the impact for each event relative to the impact of other events;

generating, using the event-specific impact score for each event, a normalized impact index for the plurality of events, wherein the normalized impact index comprises one or more distributions of impact magnitudes for the plurality of events;

for each event of the plurality of events, generating a digitally stored master event profile, wherein the master event profile is generated using the normalized impact index and one or more variables associated with each event, and wherein the digitally stored master event profile comprises one or more distributions of impact magnitudes for each event;

for each event of the plurality of events, using a first programmed algorithm, determining a relative weighting of potential impact of the event on safety, health, production efficiency or economics for the oil or gas processing operation using digitally stored data representing local conditions and the digitally stored master event profile for the event;

for each event of the plurality of events, generating one or more control assessment frameworks, wherein each control assessment framework is associated with a control effort that have been defined for the oil or gas processing operation, and wherein each control assessment framework is a tree data structure comprising of one or more nodes, and wherein each node represents a component of the control effort;

for each event of the plurality of events, using the one or more control assessment frameworks, determining and digitally storing an effectiveness value representing an effectiveness of one or more control efforts that have been defined for the oil or gas processing operation;

for each event of the plurality of events, using a second programmed algorithm, determining and digitally storing a score value using the relative weighting of the potential impact of the event and the effectiveness value of the one or more control efforts;

determining the objective digitally stored score value for the oil or gas processing operation using the score value for each event of the plurality of events and benchmarking the objective digitally stored score value to a plurality of objective digitally stored score values for other oil or gas processing operations;

wherein the steps are performed using one or more processors.

12. The computer system of claim 11, wherein the oil or gas processing operation is an oil processing operation, an oil well, a natural gas processing operation, a natural gas well, or a salt water disposal well.

13. The computer system of claim 11, wherein local conditions comprise one or more of: population density, community engagement, sensitivity of environment, animal density, and land value.

14. The computer system of claim 11, wherein the plurality of data comprises one or more of: a latitude value, a longitude value, an address value, a temperature value, a pressure value representing a pressure of a well, a well depth value, and digital values representing the one or more control efforts.

15. The computer system of claim 11, wherein the one or more variables associated with each event is based on one or more of: historical data, research data, analogous data, and expert data.

16. The computer system of claim 15, wherein the master event profile is associated with a geographical region.

17. The computer system of claim 11, wherein the effectiveness of the one or more control efforts is relative.

18. The computer system of claim 11, the one or more sequences of instructions further causing the processor to perform: determining an absolute effectiveness for each of the one or more control efforts for a particular event using a plurality of occurrences of the particular event and any control efforts in place.

19. The computer system of claim 11, wherein the plurality of other oil or gas processing operations comprise oil or gas processing operations of different companies and oil or gas processing operations in different locations.

20. The computer system of claim 11, the one or more sequences of instructions further causing the processor to perform: providing one or more suggestions for improving the objective digitally stored score value.

* * * * *